United States Patent
Shiozaki et al.

[11] Patent Number: 6,153,823
[45] Date of Patent: Nov. 28, 2000

[54] PHOTOELECTRIC CONVERSION ELEMENT HAVING A SURFACE MEMBER OR A PROTECTION MEMBER AND BUILDING MATERIAL USING THE SAME

[75] Inventors: Atsushi Shiozaki, Soraku-gun; Keishi Saito, Nara; Masahiro Kanai, Soraku-gun; Hirokazu Ohtoshi; Naoto Okada, both of Nara, all of Japan

[73] Assignee: Canon Kabushiki Kaisha, Tokyo, Japan

[21] Appl. No.: 09/037,825

[22] Filed: Mar. 11, 1998

[30] Foreign Application Priority Data

Mar. 11, 1997 [JP] Japan ................................ 9-056077

[51] Int. Cl.[7] .................................................. H01L 25/00
[52] U.S. Cl. ........................... 136/249; 136/251; 136/293
[58] Field of Search .................................. 136/249, 251, 136/293, 249 TJ; 257/433, 436, 458

[56] References Cited

U.S. PATENT DOCUMENTS

| 5,298,086 | 3/1994 | Guha ........................................ 136/249 |
| 5,439,533 | 8/1995 | Saito et al. .............................. 136/258 |
| 5,480,494 | 1/1996 | Inoue ...................................... 136/251 |
| 5,578,141 | 11/1996 | Mori et al. ............................. 136/251 |
| 5,582,653 | 12/1996 | Kataoka et al. ........................ 136/251 |

FOREIGN PATENT DOCUMENTS

| 0 559 141 | 9/1993 | European Pat. Off. . |
| 0 680 095 | 11/1995 | European Pat. Off. . |
| 0 680 096 | 11/1995 | European Pat. Off. . |
| 0 680 097 | 11/1995 | European Pat. Off. . |
| 8-139347 | 5/1996 | Japan ........................... H01L 31/021 |

OTHER PUBLICATIONS

Vecchi, Integrated Tandem Solar Cells p. 383–388, 1979.
Dalal, Realistic Design of Monolithic, Multiple–Junction Amorhous Solar Cells 17th IEEE Photovoltaic Specialists Conf. p. 86–91, May 1984.
Patent Abstracts of Japan, vol. 006, No. 060 (E–102), Apr. 17, 1982 (corresponds to JP 57-001263).
D.L. Staebler, "Reversible Conductivity Changes in Discharge—Produced Amorphous Si", App. Phys. Let., vol. 31, No. 4, Aug. 15, 1977, pp. 292–294.

Primary Examiner—Mark Chapman
Attorney, Agent, or Firm—Fitzpatrick, Cella, Harper & Scinto

[57] ABSTRACT

A photoelectric conversion element comprising a substrate, a plurality of semiconductor junctions made of non-single-crystalline semiconductors formed on the substrate, and a surface material covering the semiconductor junctions is provided. The semiconductor junctions have respective absorption spectra different from each other and respective photo-deterioration rates different from each other. A photo-current generated by the semiconductor junction of the least deterioration rate is larger than that by the semiconductor junction of the greatest deterioration rate when no surface material is present, and when present, the surface material absorbs light in a range corresponding to a part of the absorption spectrum of the semiconductor junction of the least deterioration rate, so that the photo-current generated by the semiconductor junction of the least deterioration rate becomes smaller than that by the semiconductor junction of the greatest deterioration rate.

23 Claims, 8 Drawing Sheets

PHOTOELECTRIC CONVERSION ELEMENT HAVING A SURFACE MEMBER OR A PROTECTION MEMBER AND BUILDING MATERIAL USING THE SAME

BACKGROUND OF THE INVENTION

1. Field of the Invention

The present invention relates to a photoelectric conversion element such as a solar cell or a sensor, having a plurality of semiconductor junctions in order to increase the conversion efficiency and having a protection member covering a photoelectric conversion section for protection during long-term outdoor use and suppression of photo-deterioration, and to a building material and a power generation apparatus using the same.

2. Related Background Art

A variety of photoelectric conversion elements have been used heretofore as independent power supplies for electrical machinery and apparatuses or as alternative energy sources. However, the cost per unit of generated energy by such photoelectric conversion elements is still high, particularly for use as an alternative power system, and research and development is now active thereon.

For example, as to materials for the photoelectric conversion section itself, there exist crystalline materials such as single-crystal silicon or polycrystalline silicon and so-called thin-film materials using amorphous silicon or compound semiconductors.

There is technology aimed to increase the conversion efficiency via the layer structure of the photoelectric conversion section consisting of a plurality of semiconductor junctions, for example, as described in U.S. Pat. No. 5,298,086.

One of the techniques for producing photoelectric conversion elements at low cost is a thin-film semiconductor production technique using a rolled stainless steel substrate and continuously forming a thin semiconductor layer thereon by use of microwave which increases the deposition rate.

A further technique is one that effectively utilizes light by providing an anti-reflection layer also serving as an electrode on the semiconductor junction layer.

In addition to these, various techniques are necessary not only for the photoelectric conversion section, but also for matters of product forms and durability and a method for connection to the system power, which are significant in practical use. Thus, research and development thereof is under way.

Particularly, solar cells are required to be designed so as to endure long-term outdoor use. Therefore, in addition to the glass protection member normally used, there are also proposals on protective members having a lightweight and flexible configuration, for example as described in Japanese Laid-open Patent Application No. 8-139347, in which the outermost surface is a transparent thin film of a fluoride polymer such as a fluororesin film and in which an encapsulating resin selected from a variety of thermoplastic, transparent, organic resins is provided inside thereof.

It is also known generally that this protection member can also have the anti-reflection effect by setting the index of refraction of the protection member between those of a transparent, resistive layer and the atmosphere.

So-called stacked device technology refers to connecting plural semiconductor junctions in series in order to increase the conversion efficiency, as described above. Generally speaking, when a configuration of two semiconductor junctions with an equal band gap is compared with a configuration of one semiconductor junction having a thickness equal to the overall thickness of the two junctions, the conversion efficiency of the double junction configuration is greater, because transit lengths of carriers are shorter and thus recombination thereof is less. In addition, the electromotive force increases while output current decreases. Therefore, the internal resistance loss due to the current decreases, so that the conversion efficiency increases. Still higher conversion efficiency can be achieved by forming plural semiconductor junctions of different band gaps and thus utilizing the light in a wide wavelength region.

However, when plural semiconductor junctions are used, how to determine conditions of each semiconductor junction becomes complicated and finding the most efficient configuration is not always easy. Particularly complex are configurations of three or more semiconductor junctions. Finding guidance and increasing freedom of design are important issues.

While such techniques to increase conversion efficiency have been researched, the most significant point in terms of the utilization of a photoelectric conversion element is that the total performance including amounts of materials used, costs for production, installation area, external view, and so on is commensurate with the resultant energy. It is thus noted that the conversion. efficiency from light to electricity is not always most important. This is the reason why attention is being paid to amorphous-based photoelectric conversion elements which can be made at considerably lower cost though having somewhat smaller conversion efficiency than the crystal-based photoelectric conversion elements exhibiting high conversion efficiency.

The amorphous silicon based semiconductors will experience the photo-deterioration phenomenon discovered by D. L. Staebler and C. R. Wronski (Applied Physics Letters, Vol. 31, No. 4, Aug. 15, 1977, p 292). This photo-deterioration phenomenon has yet to be overcome, and it is thus a significant matter to determine optimum configuration, taking account of the balance among conversion efficiencies including photo-deterioration after long-term use, as well as the initial conversion efficiency, the cost, and the like.

SUMMARY OF THE INVENTION

An object of the present invention is to propose an excellent configuration of photoelectric conversion element that shows less photo-deterioration and high conversion efficiency, that can be made at low cost, and that is lightweight and flexible, and a building material and a power generation apparatus using it.

Another object of the present invention is to provide a photoelectric conversion element, conversion efficiencies of which are maintained almost constant during long-term use, and a building material and a power generation apparatus using it.

First, the present invention has the first feature of a photoelectric conversion element comprising a substrate; a photoelectric conversion section having a lamination in which a plurality of semiconductor junctions of amorphous semiconductors placed on the substrate are stacked, and a light incident surface, wherein the plurality of semiconductor junctions in the lamination have respective absorption spectra different from each other and respective deterioration rates different from each other with respect to photo-deterioration induced by exposure to light and wherein two types of semiconductor junctions are provided so that a photo-current based on the semiconductor junction of the least deterioration rate is larger than that based on the semiconductor junction of the greatest deterioration rate; and a surface material provided on the light incident surface, the surface material absorbing light in a region of the absorption spectrum of the semiconductor junction of the least deterioration rate, so that the photo-current based on the semiconductor junction of the least deterioration rate becomes smaller than that based on the semiconductor junction of the greatest deterioration rate.

Second, the present invention has the second feature of a photoelectric conversion element that shows less deterioration and high conversion efficiency, that can be produced at low cost, and that is lightweight, flexible, and overall excellent, by a configuration in which a surface material of a transparent, conductive layer and a protection member, each having a low transmittance in a wavelength region of specific light, is provided on a light incident surface of a photoelectric conversion section comprised of a plurality of non-single-crystal semiconductor junctions and in which a photo-current generated by the semiconductor junction with the best performance out of the plurality of semiconductor junctions when exposed to light through the surface material is always smaller than those generated by the other semiconductor junctions during long-term use.

Third, the present invention has the third feature of a building material having a) a photoelectric conversion element comprising a substrate, and a photoelectric conversion section having a lamination in which a plurality of semiconductor junctions of amorphous semiconductors placed on the substrate are stacked, and a light incident surface, wherein the plurality of semiconductor junctions in the lamination have respective absorption spectra different from each other and respective deterioration rates different from each other with respect to photo-deterioration induced by exposure to light and wherein two types of semiconductor junctions are provided so that a photo-current based on the semiconductor junction of the least deterioration rate is larger than that based on the semiconductor junction of the greatest deterioration rate; b) a back surface material; and c) a surface material provided on the light incident surface of the photoelectric conversion element, the surface material absorbing light in a region of the absorption spectrum of the semiconductor junction of the least deterioration rate, so that the photo-current based on the semiconductor junction of the least deterioration rate becomes smaller than that based on the semiconductor junction of the greatest deterioration rate, said building material having an encapsulating structure in which the surface material and the back surface material are integrally encapsulated.

Fourth, the present invention has the fourth feature of a power generation apparatus comprising a) a photoelectric conversion element comprising a substrate; a photoelectric conversion section having a lamination in which a plurality of semiconductor Junctions of amorphous semiconductors placed on the substrate are stacked, and a light incident surface, wherein the plurality of semiconductor junctions in the lamination have respective absorption spectra different from each other and respective deterioration rates different from each other with respect to photo-deterioration induced by exposure to light and wherein two types of semiconductor junctions are provided so that a photo-current based on the semiconductor junction of the least deterioration rate is larger than that based on the semiconductor junction of the greatest deterioration rate; and a surface material provided on the light incident surface, the surface material absorbing light in a region of the absorption spectrum of the semiconductor junction of the least deterioration rate, so that the photo-current based on the semiconductor junction of the least deterioration rate becomes smaller than that based on the semiconductor junction of the greatest deterioration rate; and b) power converting means for converting power generated by the photoelectric conversion element to predetermined power.

The inventors have studied extensively and intensively on how to achieve a photoelectric conversion element that has high conversion efficiency, less photo-deterioration, and high reliability and that can be made readily. The inventors have achieved the invention described below.

The present invention adopts the photoelectric conversion element in which a plurality of semiconductor junctions of non-single-crystal semiconductors are stacked.

The inventors discovered that the maximum conversion efficiency was achieved by using a configuration in which thicknesses of the respective semiconductor junctions varied so as to increase toward the substrate from the thinnest to the thickest. The inventors compared the absorption spectra of the respective semiconductor junctions in that configuration with those after a photo-deterioration test and found a semiconductor junction with good characteristics showing the least deterioration. On the other hand, the inventors also found that when the photoelectric conversion element was again made so that the photo-current of the semiconductor junction with the best characteristics (of less deterioration) was always smaller than those of the other semiconductor junctions during long-term use, the initial conversion efficiency was maintained with little decrease and the degree of photo-deterioration was reduced. This is conceivably because the characteristics of the photoelectric conversion element are dominated by the behavior of the semiconductor junction with the best characteristics. The semiconductor junction with the best characteristics can also be found by the fill factor of current-voltage curve, measurement of spin density by electron spin resonance, or measurement of carrier transit mobility by the time-of-flight method when a photoelectric conversion element is made of each single semiconductor junction.

In addition to the above, the inventors also found the following. Sunlight includes light of a wide wavelength range including ultraviolet light of 300 nm to infrared light of 1000 nm or more (FIG. 3). The conversion efficiency of the photoelectric conversion element increases as the whole of the sunlight is utilized as much as possible. However, there also exists unuseful-wavelength light in practice. This unuseful-wavelength light is preferably prevented from reaching the photoelectric conversion section, because it induces photo-deterioration. The inventors also found that even among the useful wavelengths, there were wavelengths that should be preferably kept from reaching the photoelectric conversion section, when considering the contribution to photoelectric conversion and the inducement of photo-deterioration. For example, ultraviolet rays near 350 nm have high energy per photon and thus strongly induce photo-deterioration. Therefore, they are better reflected or absorbed by a protection member of a resin or the like provided on the surface to such a level as not to overall decrease the conversion efficiency.

When the photoelectric conversion element is used as a roof material, the external view and tone of color sometimes become important factors. There are some cases in which light of a specific wavelength is intentionally reflected so as to give a tone of color. The transmittance is decreased of the light of the specific wavelength region in this case.

The present invention has been accomplished noting the relationship between the photo-deterioration of plural semiconductor layers and the protection member. Namely, the inventors discovered that when the photoelectric conversion element was constructed so that the photo-current of a semiconductor junction corresponding to the specific wavelength region out of the plural semiconductor junctions was generated more when the protection member was absent and so that after the protection member (encapsulating member) was provided and even after the photo-current was decreased, the photo-current of the semiconductor junction with the best characteristics always became smallest during long-term use, the characteristics of this semiconductor junction with the best characteristics dominated those of the whole photoelectric conversion element.

By determining the configuration of the plural semiconductor junctions and providing the protection member not transmitting the light of the specific wavelength region as described above, photo-deterioration can be controlled to a low level without largely decreasing conversion efficiency.

In addition to these, the thickness is generally increased in order to increase the current. This also has the effect of decreasing such defects as to fail to cover the shape of the substrate. It also has the effect that the photoelectric conversion element is obtained with high reliability, because the extent of breakage is improved under application of voltage.

Further, in addition to these, the photo-current of the associated semiconductor junction can be adjusted by adjusting the thickness and distribution of the protection member that does not transmit the light of the specific wavelength region. In the case of the semiconductor junctions produced by the plasma enhanced CVD method, correction after production is difficult, and there always exists some distribution. The adjustable thickness of the protection member also has the effect that a wide permissible range is given to the production conditions of semiconductor junction.

DETAILED DESCRIPTION OF THE PREFERRED EMBODIMENTS

Figure 1:
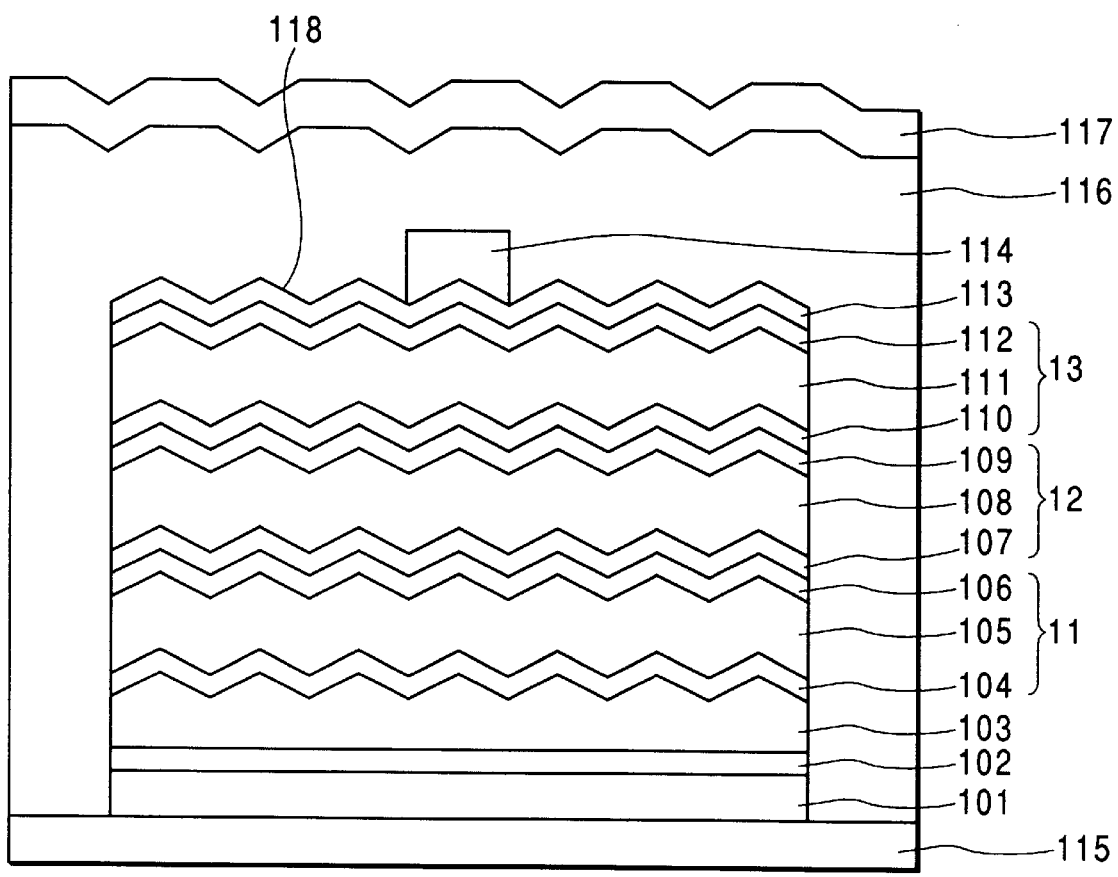
FIG. 1 is a schematic diagram to show the cross-sectional structure of an embodiment of the photoelectric conversion element of a thin-film semiconductor according to the present invention.

A cross-section of the photoelectric conversion element according to the present invention is illustrated in the schematic view of FIG. 1.

Transparent, resistive layer 103 is deposited on reflective layer 102 on substrate 101 by sputtering or electrocrystallization from an aqueous solution. The surface of transparent, resistive layer 103 is preferably provided with unevenness of several hundred nm, because it can scatter the light so as to increase conversion efficiency. The unevenness may be formed by production conditions, or the unevenness may be enhanced by wet etching of a flat surface.

Figure 2:
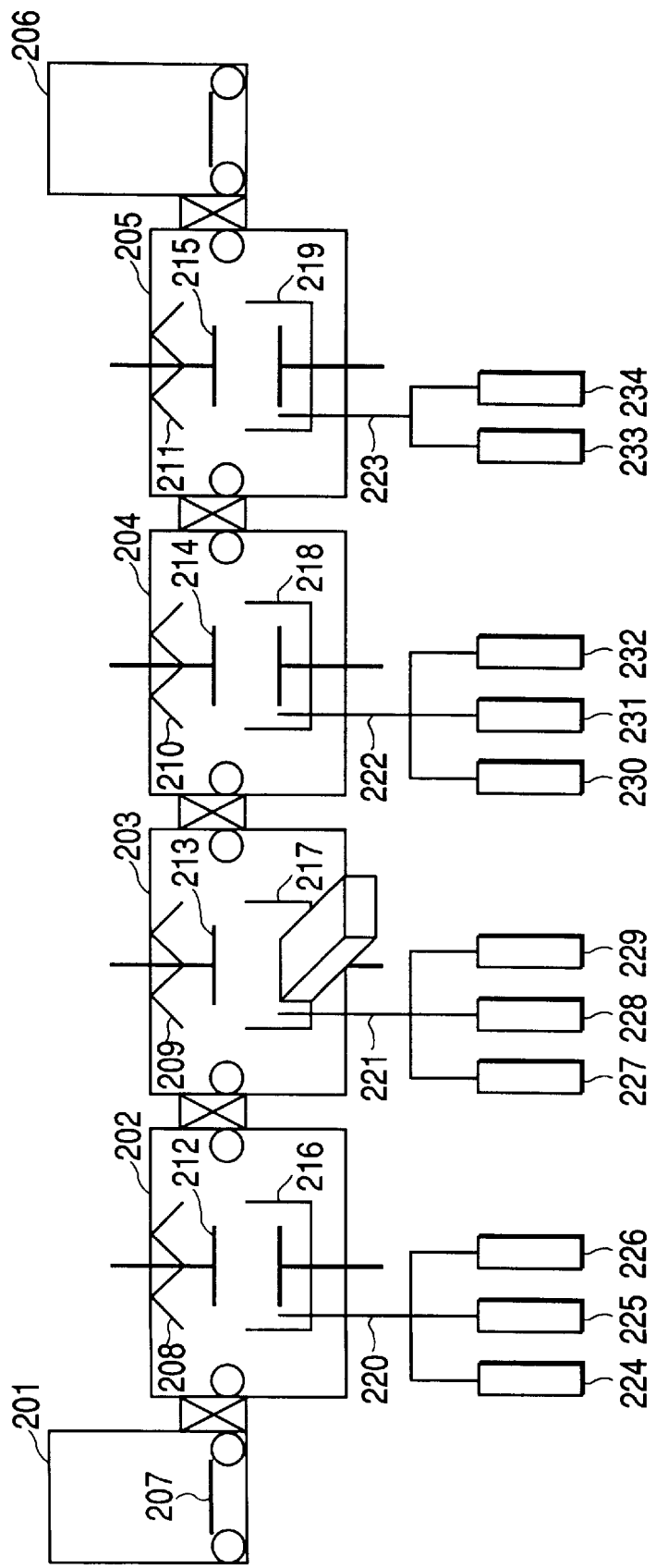
FIG. 2 is a schematic diagram to show a preferred apparatus for producing the semiconductor junction layers of the present invention.
Figure 3:
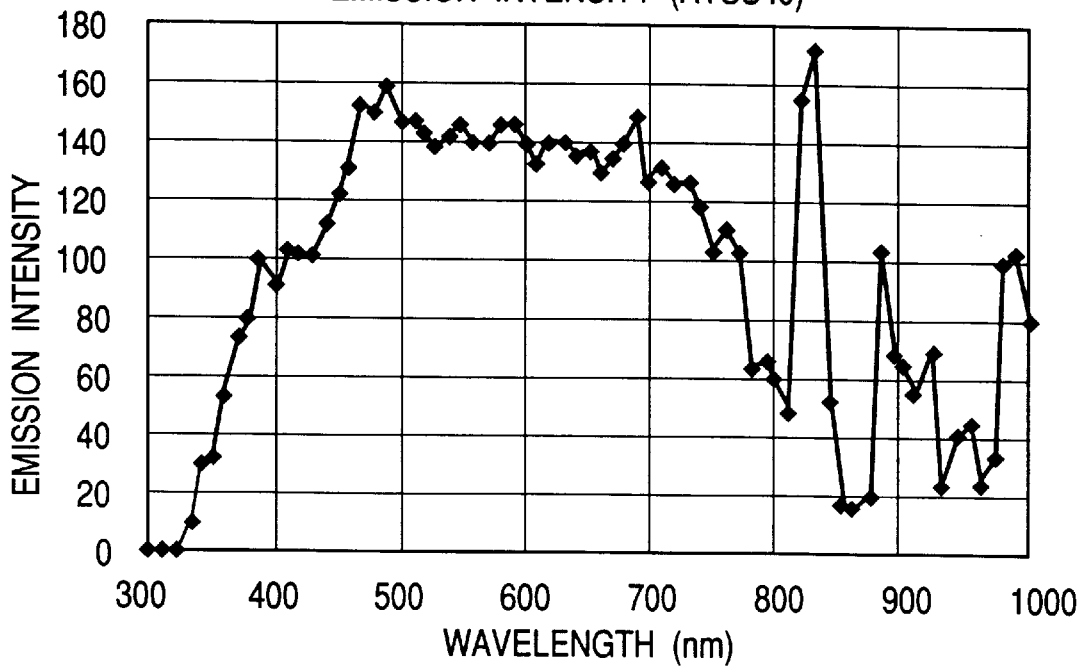
FIG. 3 is a diagram to show the spectrum of the sunlight.

This substrate is set, for example, as denoted by 207 in the vacuum apparatus shown in FIG. 2. Delivery chamber 201, deposition chambers 202, 203, 204, 205, and recovery chamber 206 are separated from each other by a gate valve, and the inside thereof is evacuated down to a predetermined pressure by a vacuum pump not illustrated. The gate valve between the delivery chamber 201 and the deposition chamber 202 is first opened, and the substrate 207 is conveyed to below substrate holder-electrode 212. Then the substrate holder-electrode 212 is moved down to contact the substrate. Then the substrate is heated by heater 208 and is kept at a predetermined temperature. Then the valve is closed and source gases of silane, phosphine, and hydrogen are supplied through gas supply pipe 220. The pressure is adjusted to a predetermined pressure by adjusting the valve travel of an exhaust valve not illustrated. Then, high-frequency power is supplied to electrode 216 for a predetermined period to produce an n-type amorphous (hereinafter referred to as "a-") Si layer 104. The source gases are once evacuated, and then the gate valve is opened. The substrate is carried into the next deposition chamber and again source gases of silane, germane, and hydrogen are supplied. After the pressure is adjusted to a predetermined pressure, a predetermined power is supplied to a waveguide pipe and bias electrode 217 for a predetermined period, thereby producing an i-type a-SiGe layer 105. By repeating this process in the same manner, a p-type microcrystal (hereinafter referred to as "μc-") Si layer is made in the deposition chamber 204, and thus the above steps complete the semiconductor junction closest to the substrate. The next nip junction 107, 108, 109 is produced in the same order, thus making the middle semiconductor junction. Further, an n-type a-Si layer 110 is made in the deposition chamber 202 in a similar fashion and thereafter an i-type a-Si layer 111 is made in the deposition chamber 205 while supplying only silane and hydrogen this time. Finally, a p-type μc-Si layer 112 is produced in the deposition chamber 204, thus completing the surface-side semiconductor junction. A sample produced by the above method was subjected to a photo-deterioration test, and deterioration rates of photo-current of the semiconductor layers were obtained. Further, the semiconductor junctions were also produced separately from each other by the same method as described above, and fill factors thereof were also measured. In addition, another sample was produced in such structure that only the three i-layers were deposited thicker under the same conditions, the spin density was measured by electron spin resonance, and the transit mobility of carriers was measured by the time-of-flight method. The results are listed together in Table 1 below; the surface-side semiconductor junction showed the best characteristics. This is considered to be due to the influence of microwave power, which achieves the fast deposition rate, and the difference between silicon and silicon germanium.

TABLE 1

|  | Deterioration rate | Fill factor | Spin density | Carrier mobility |
| --- | --- | --- | --- | --- |
| Top | −1 to −2% | 0.73–0.75 | 1–2 × $10^{15}$/cm$^3$ | 0.5–1 × $10^{-7}$ cm$^2$/V |
| Middle | −1 to −3% | 0.65–0.68 | 2–3 × $10^{15}$/cm$^3$ | 0.3–0.6 × $10^{-7}$ cm$^2$/V |
| Bottom | −4 to −5% | 0.64–0.66 | 2–3 × $10^{15}$/cm$^3$ | 0.2–0.5 × $10^{-7}$ cm$^2$/V |

Therefore, in producing the sample of the present invention, in order that the photo-current of the top i-type a-Si 111 becomes greater than that of at least one of the other semiconductor junctions when the protection member is absent, a concentration of the source gases is increased, the temperature of the substrate is increased, the band gap is changed, a ratio of silicon and germanium is changed, or the deposition time is lengthened. For producing the semiconductor junctions, various powers of frequencies ranging from microwaves to high frequencies such as 2.45 GHz, 500 MHz, or 105 MHz can be used in addition to the microwave and high frequency described above.

The surface of the semiconductor junctions often reflects the unevenness of the transparent, resistive layer.

Anti-reflection layer 113, also serving as a transparent electrode, is further formed on the surface of the semiconductor junctions in another vacuum apparatus.

Figure 5:
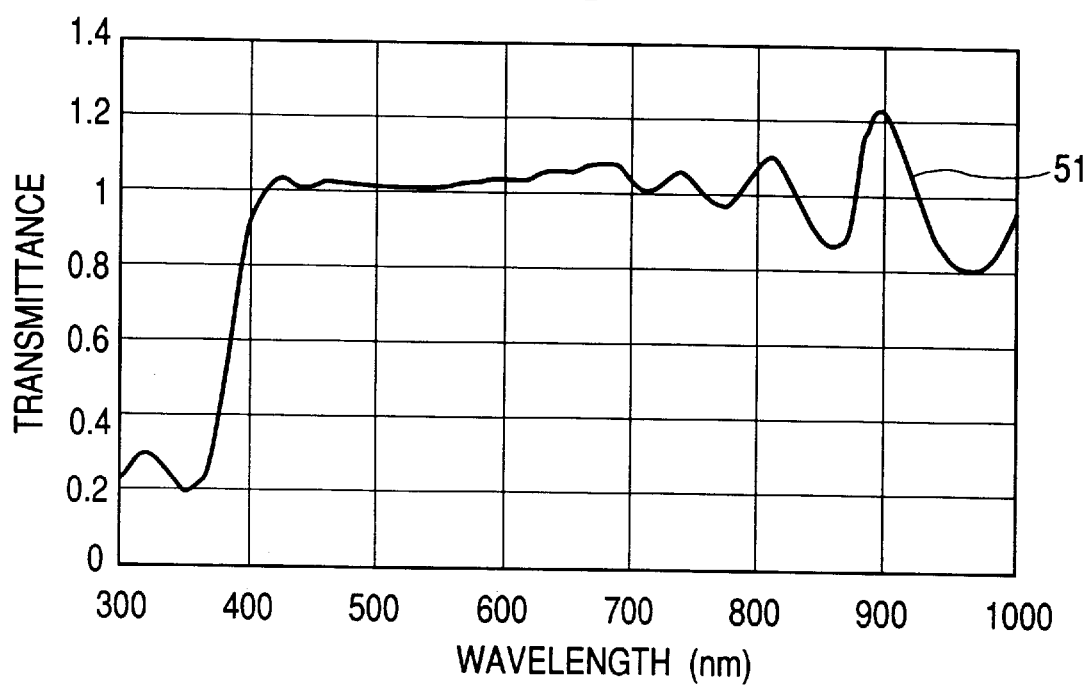
FIG. 5 is a diagram to show transmittance characteristics of the example of the protection member (surface encapsulating material 116 and surface film 117) according to the present invention.

Comb-shaped electrode 114 is provided on the anti-reflection layer 113, and an output electrode is attached thereto. Back surface material 115 is a steel sheet. Further, a thin film of a fluoride polymer as surface film 117 and a thermoplastic, transparent, organic resin as surface encapsulating material 116 are bonded onto light incident surface 118 of the top surface. These members 116 and 117 compose the protection member, thus completing the photoelectric conversion element. This thermoplastic, transparent, organic resin as the surface encapsulating material 116 contained an ultraviolet absorbing material having the transmittance characteristics 51 shown in FIG. 5. The reasons why wavelength regions over the transmittance 1.0 exist in the transmittance characteristics of the ultraviolet absorber in FIG. 5 are that the transmittance characteristics are those 51 where the ultraviolet absorber is provided on the anti-reflection layer 113 being a transparent, conductive layer with the index of refract ion of 2.0 and that the anti-reflection effect is achieved because the index of refraction of the protection member itself is about 1.5.

Figure 4:
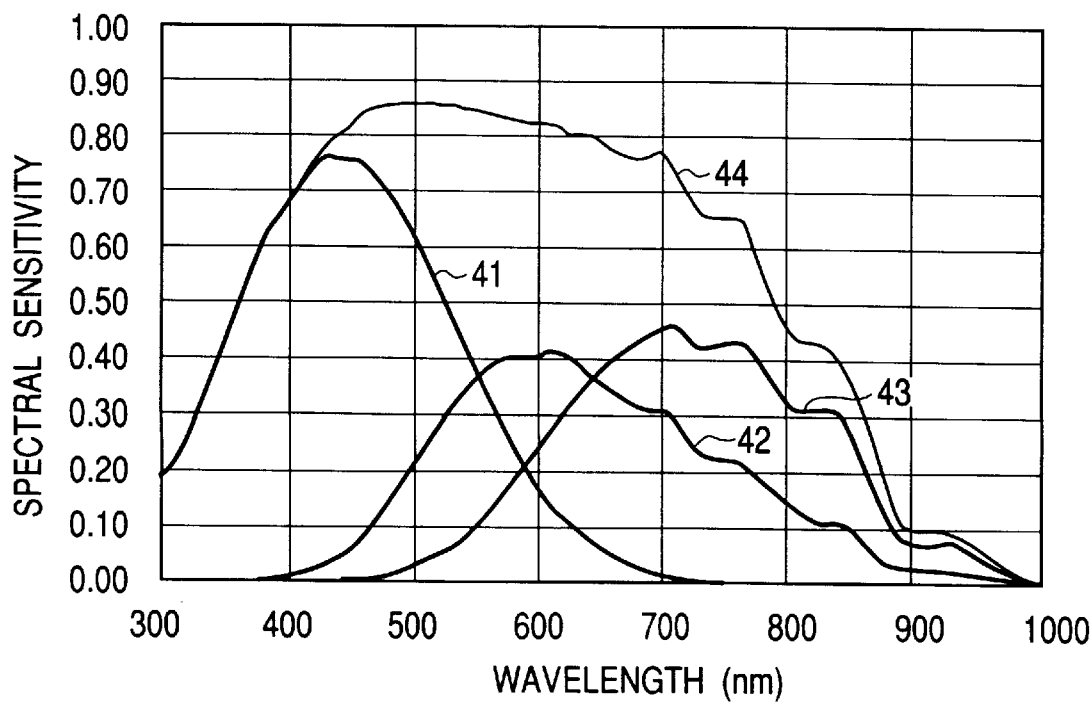
FIG. 4 is a drawing to show absorption spectra obtained before an example of the protection member (surface encapsulating material 116 and surface film 117) according to the present invention was given.

FIG. 4 shows absorption spectra of the photoelectric conversion element obtained before the protection member comprised of the above surface encapsulating material 116 and surface film 117 was provided. In the same figure, numeral 41 designates an absorption spectrum of the top semiconductor junction, 42 that of the middle semiconductor junction, 43 that of the bottom semiconductor junction, and 44 an overall absorption spectrum of the triple cell in which these three semiconductor junctions are stacked.

In FIG. 4, it is seen that this photoelectric conversion element utilizes light in a broad range from 300 nm to 900 nm. Photo-currents (JSC) generated by the surface-side semiconductor junction (top semiconductor junction), the intermediate semiconductor junction (middle semiconductor junction), and the substrate-side semiconductor junction (bottom semiconductor junction) at this time were 7.63 mA/cm$^2$, 7.45 mA/cm$^2$, and 7.78 mA/cm$^2$, respectively.

Figure 6:
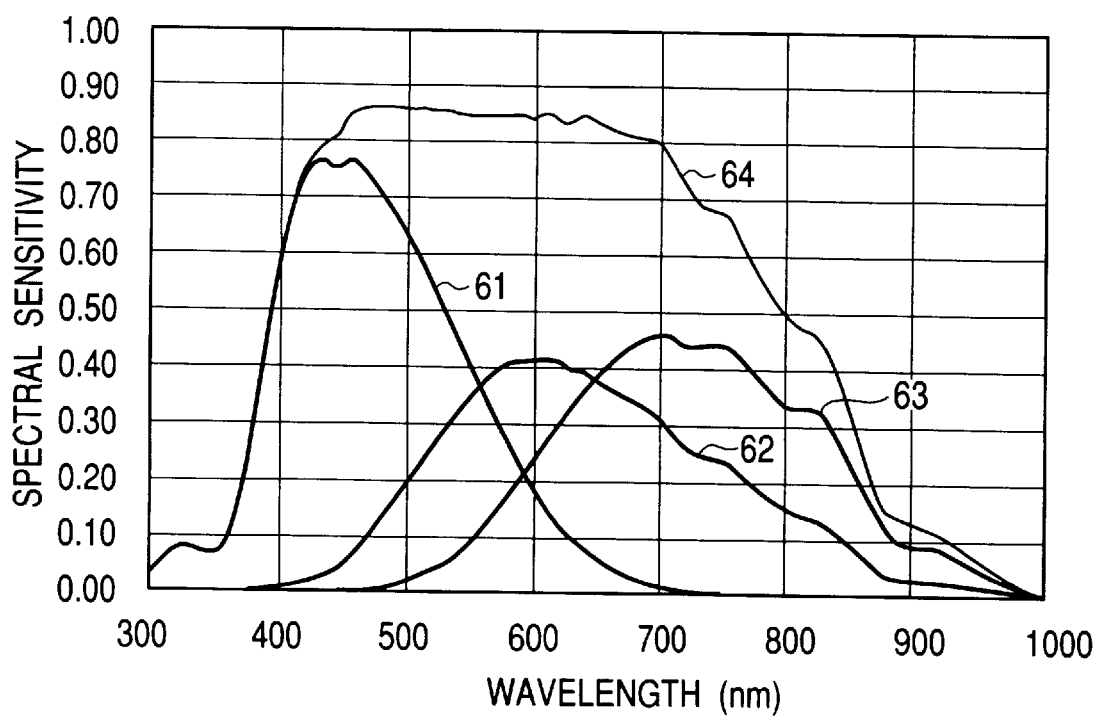
FIG. 6 is a drawing to show absorption spectra obtained after the example of the protection member (surface encapsulating material 116 and surface film 117) according to the present invention was given.

FIG. 6 shows the results of measurements, similar to the above, conducted after the protection member of the above surface encapsulating material 116 and surface film 117 was provided on the above-described photoelectric conversion element, i.e., on the light incident surface 118.

In FIG. 6, numeral 61 represents an absorption spectrum of the top semiconductor junction, in which light in the wavelength range of 350 nm and less is effectively cut, thereby suppressing photo-deterioration of the middle semiconductor junction and bottom semiconductor junction. In a preferred embodiment of the present invention, the surface encapsulating material 116 preferably contains the ultraviolet absorber in an amount sufficient to suppress the photo-deterioration of the middle semiconductor junction and bottom semiconductor junction and with such absorption characteristics as not to substantially lower the absorption spectrum of the top semiconductor junction. Numeral 62 denotes an absorption spectrum of the middle semiconductor junction, 63 that of the bottom semiconductor junction, and 64 an overall absorption spectrum of the triple cell in which these three semiconductor junctions are stacked.

The photo-currents generated by the top, middle, and bottom semiconductor junctions at this time were 7.33 mA/cm$^2$, 7.60 mA/cm$^2$, and 7.97 mA/cm$^2$, respectively.

The solar cell, becoming the photoelectric conversion element after provision of the above protection member, had an initial conversion efficiency of 10.2%, and the conversion efficiency after the deterioration test was 8.7%.

Figure 7:
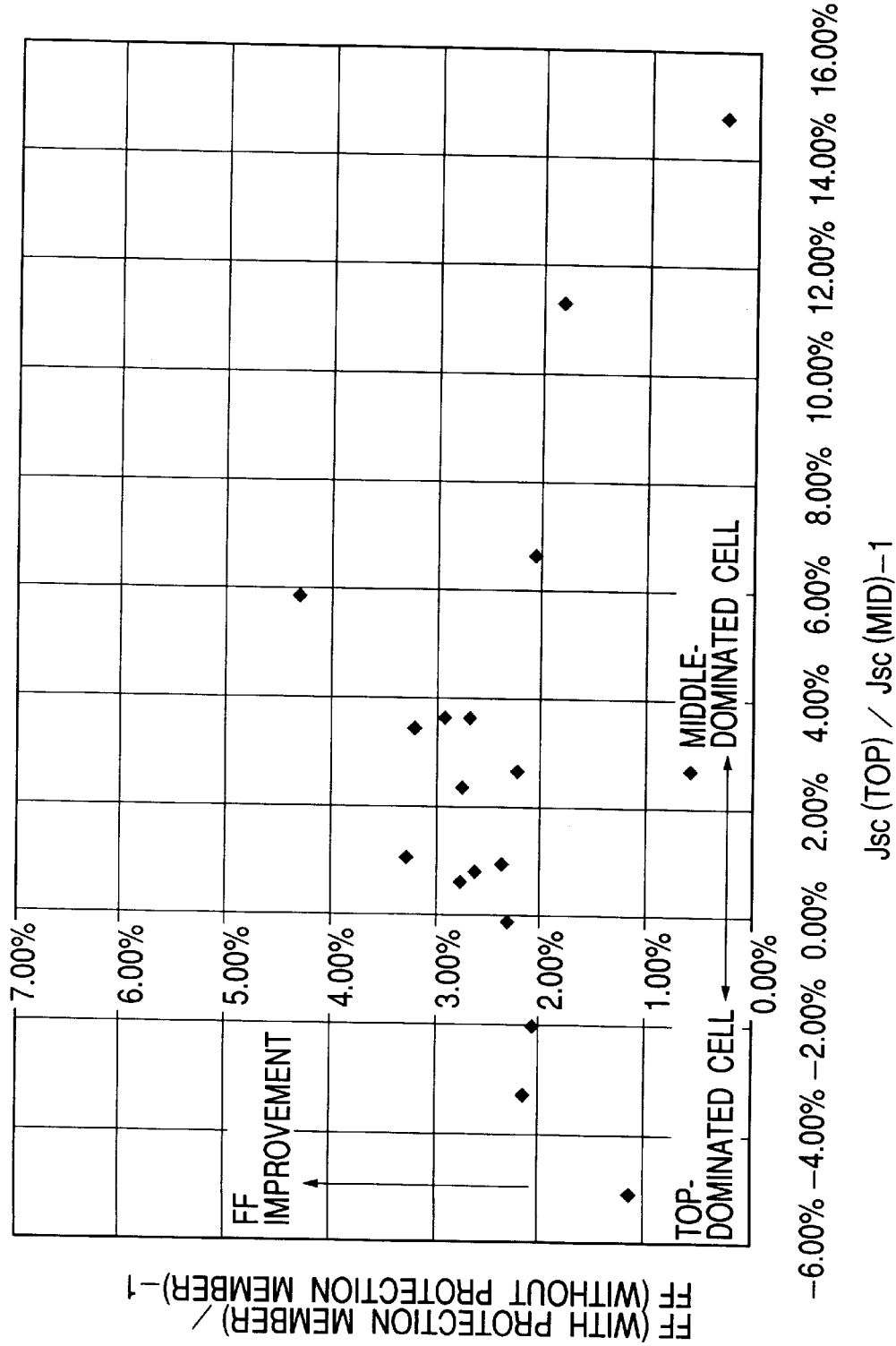
FIG. 7 is a diagram to show degrees of change in fill factor before and after the example of the protection member (surface encapsulating material 116 and surface film 117) according to the present invention was provided.

FIG. 7 shows plots of measurement results of respective samples, including many samples (top-dominated cells) obtained by changing the deposition conditions, designed thicknesses, etc. and selecting various conditions so that a minimum photo-current was generated in the top semiconductor junction and many samples (middle-dominated cells) obtained by selecting the deposition conditions etc. so that a minimum photo-current was generated in the middle semiconductor junction.

In FIG. 7, the abscissa indicates plots of respective samples of JSC (Top)/JSC (Mid)−1 (%) which is a value obtained by subtracting 1 from a ratio of the photo-current [JSC (Top)] of the surface-side semiconductor junction (top semiconductor junction) to the photo-current [JSC (Mid)] of the intermediate semiconductor junction (middle semiconductor junction) before formation of the above protection member.

In FIG. 7, the ordinate represents plots of the respective samples of FF (without the protection member)/FF (with the protection member)−1 (%) which is a value obtained by subtracting 1 from a ratio of the fill factor [FF (with-the protection member)] of the photoelectric conversion element after formation of the protection member to the fill factor [(FF (without the protection member)] of the photoelectric conversion element before formation of the above protection member. In the drawing, a "top-dominated" cell means a solar cell in which a minimum photo-current is generated in the top semiconductor junction, and a "middle-dominated" cell means a solar cell in which a minimum photo-current is generated in the middle semiconductor junction. Further, "FF improvement" indicates progress in the improvement of FF along the direction of the arrow. FIG. 7 shows change in the fill factor after formation of the protection member.

Figure 8:
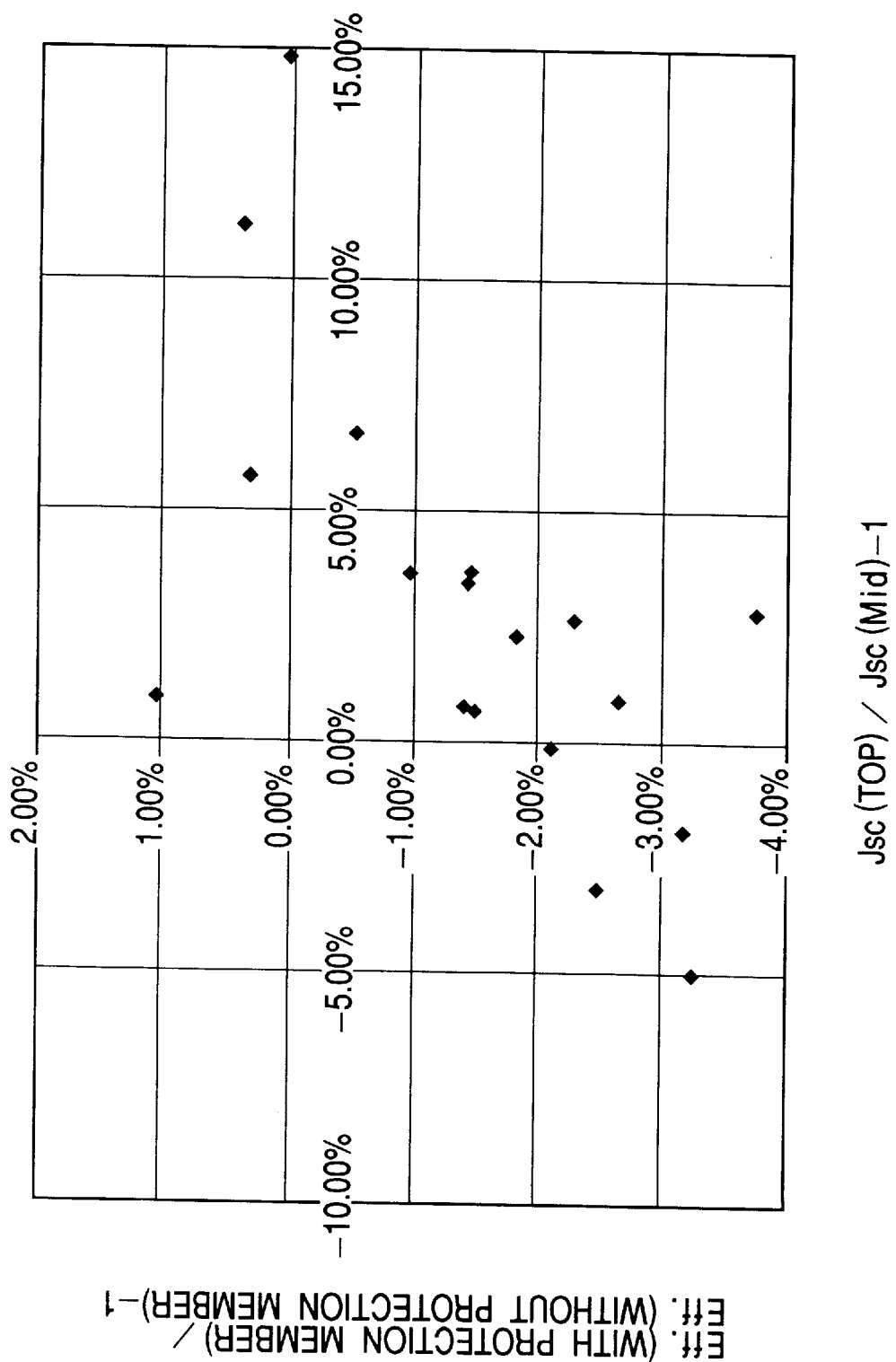
FIG. 8 is a diagram to show degrees of change in conversion efficiency before and after the example of the protection member (surface encapsulating material 116 and surface film 117) according to the present invention was provided.

The abscissa of FIG. 8 represents values obtained by subtracting 1 from a ratio of the photo-current [JSC (Top)] of the top semiconductor junction to the photo-current [JSC (Mid)] of the middle semiconductor junction in the photoelectric conversion element before formation of the protection member.

Therefore, plotted on the abscissa are values of JSC (Top)/JSC (Mid)−1 (%); plotted on the ordinate are values of the respective samples of Eff (with the protection member)/Eff (without the protection member)−1 (%) which is a value obtained by subtracting 1 from a ratio of the conversion efficiency of the photoelectric conversion element after formation of the protection member [Eff (with the protection member)] to the conversion efficiency of the photoelectric conversion element before formation of the protection member [Eff (without the protection member)]. Accordingly, FIG. 8 shows change in conversion efficiency, and it is seen from the drawings that when the protection member is provided in such a way that the photo-current of the top semiconductor junction is 0 to 6% greater than that of the middle semiconductor junction, especially in such a way that the photo-current of the top semiconductor junction is 3 to 5% greater, the fill factor (FF) is best and the decrease in conversion efficiency is relatively small.

As described above, the photoelectric conversion element using the protection member containing the ultraviolet absorber has a high fill factor and an increased photoelectric conversion efficiency. The photoelectric conversion element shows little change in the characteristics over a long period and a great improvement in reliability.

Figure 9:
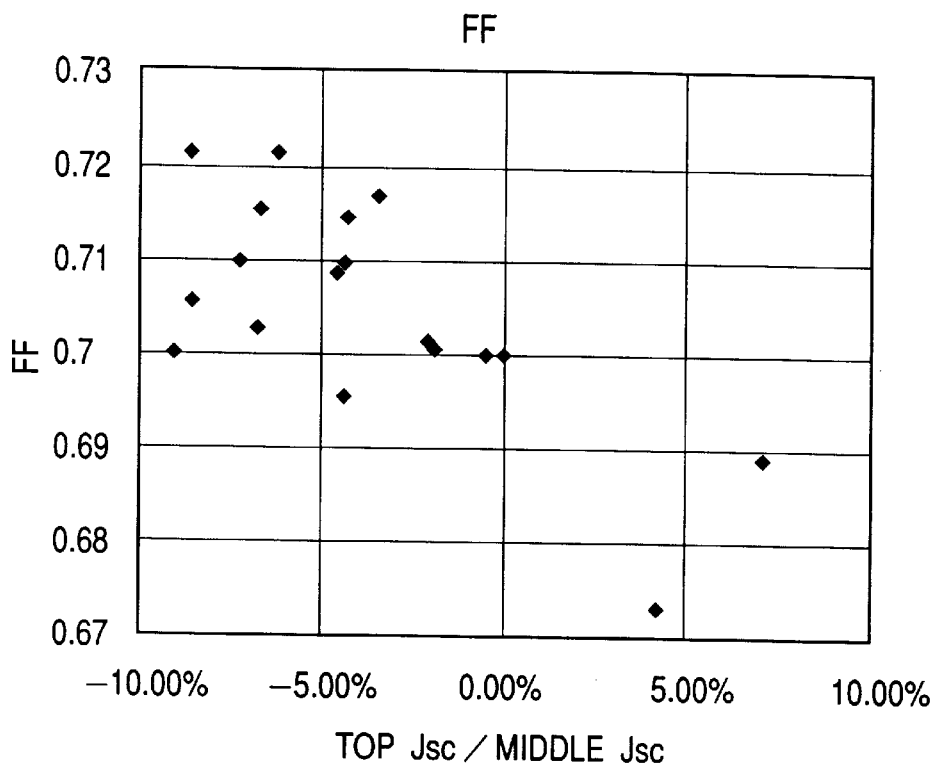
FIG. 9 is a diagram to show fill factors after the example of the protection member (surface encapsulating material 116 and surface film 117) according to the present invention was provided.
Figure 10:
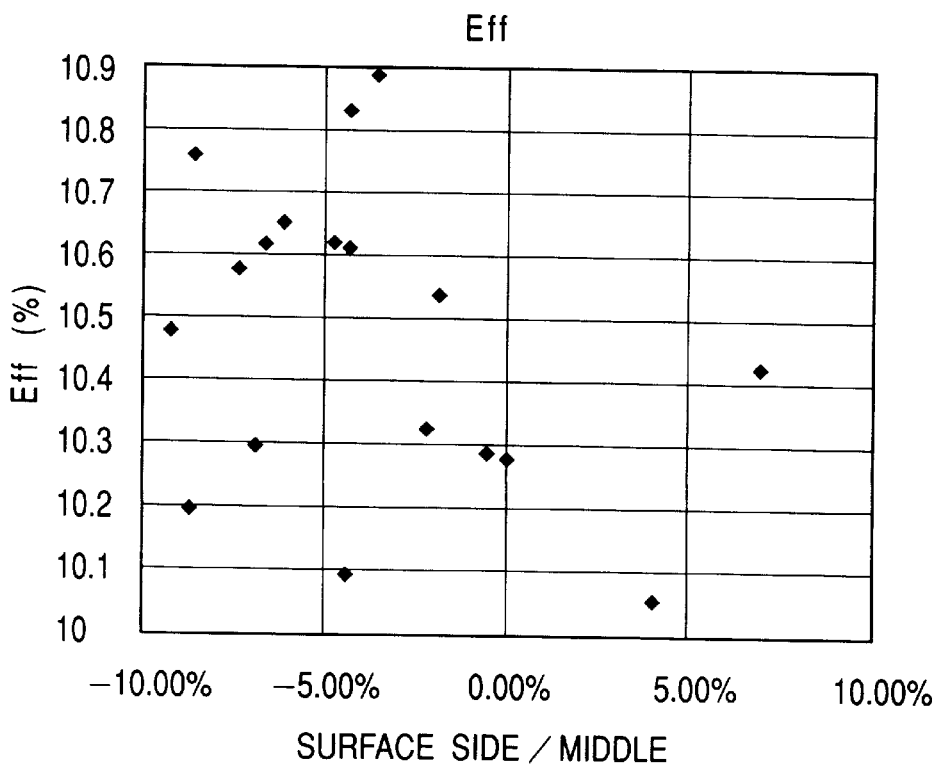
FIG. 10 is a diagram to show conversion efficiencies after the example of the protection member (surface encapsulating material 116 and surface film 117) according to the present invention was provided.

The abscissa of FIG. 9 represents the ratio of photo-current generated in the top semiconductor junction (top JSC) to the photo-current generated in the middle semiconductor junction (middle JSC) after formation of the protection member comprised of the surface encapsulating material 116 and surface film 117, and the ordinate represents the fill factor (FF) after formation of the protection member.

The black dots in FIGS. 7, 8, and 9 are plots of measurement results on the above graph axes for the different photoelectric conversion elements prototyped under various conditions.

The constituent elements of the present invention will be described one by one.

Substrate 101

The substrate 101 also serves as a lower electrode opposite to the other electrode through the semiconductor layers and can be selected from metals, alloys, laminations of such metals or alloys, a carbon sheet with a reflective layer formed thereon, a resin film with a conductive layer formed thereon, and so on. Since these materials can be used in a roll form, they are suitable for continuous production. The substrate can also be selected from those obtained by providing a crystal substrate of silicon or the like or a glass or ceramic plate with a reflective layer or a conductive layer, depending upon uses thereof. The surface of the substrate may be polished or cleaned, but the substrate may be used as is. The surface of the substrate may be roughened. If the substrate is of a magnetic material such as stainless steel (SUS430), the substrate can be conveyed while the position thereof is accurately controlled by rollers including a magnet.

Reflective Layer 102

When the substrate has high reflectivity, the reflective layer 102 does not have to be provided separately. When the substrate 101 is of stainless steel or a carbon sheet, an aluminum layer is formed by sputtering or the like.

Transparent, Resistive Layer 103

The transparent, resistive layer 103 can be made by sputtering, vacuum vapor deposition, chemical vapor deposition, ion plating, ion beam processing, or ion beam sputtering. The transparent, resistive layer 103 can also be made by electrocrystallization or immersion plating from an aqueous solution consisting of nitrate, acetate, and ammonium groups and metal ions. A desired property of the resistive layer is high transparency for transmitting light to the substrate. The resistive layer desirably has a moderate resistance sufficient to restrain electric current from flowing through defects of the semiconductor layers. Specifically, the transmittance is desirably greater than 9%. The conductivity is in the range of $10^{-8}$ (1/Ωcm) to $10^{-1}$ (1/Ωcm). A material of the resistive layer can be selected from zinc oxide, indium oxide, tin oxide, and materials containing such oxides.

The surface of the resistive layer can be roughened on the order of several hundred nm by controlling production conditions. If the surface is flat, the surface may be roughened by wet etching with a solution of acetic acid or the like. For example, in the case of sputtering, the roughness of the surface can be made larger by increasing the substrate temperature, decreasing the deposition rate, and increasing the thickness. In the case of the electrocrystallization from an aqueous solution, the roughness can be made larger by increasing the concentration of zinc and increasing the thickness.

Semiconductor Junctions

A CVD system utilizing power ranging from high frequencies to microwaves can be used for production of the semiconductor layers. Source gases such as $SiH_4$, $PH_3$, and $H_2$ are supplied into a vacuum chamber and the power is supplied, whereby the n-type a-Si layer 104, 107, or 110 can be made. Further, when source gases such as $SiH_4$, $GeH_4$, and $H_2$ are used, the i-type a-SiGe layer 105 or 108 can be made. When source gases such as $SiH_4$ and $H_2$ are used, the i-type a-Si layer 111 can be made. Further, the p-type μc (microcrystalline)-Si layer 106 can be made using $SiH_4$, $BF_3$, and $H_2$. Thus, a plurality of nip semiconductor junctions can be made as described. The semiconductor layers do not have to be limited to amorphous and microcrystal semiconductors as long as they are non-single-crystalline. The configuration of nip can also be replaced by the configuration of pin.

The number of semiconductor junctions can be two or more without having to be limited to three in the above example.

The semiconductor layers can be made continuously by an in-line type apparatus.

In FIG. 1, numeral 104 designates an n-type semiconductor layer, 105 an i-type semiconductor layer, and 106 a p-type semiconductor layer. These semiconductor layers 104, 105, and 106 compose the bottom pin (nip) semiconductor junction 11. Numeral 107 denotes an n-type semiconductor layer, 108 an i-type semiconductor layer, and 109 a p-type semiconductor layer. These semiconductor layers 107, 108, and 109 compose the middle pin (nip) semiconductor junction 12. Numeral 110 indicates an n-type semiconductor layer, 111 an i-type semiconductor layer, and 112 a p-type semiconductor layer. These semiconductor layers 110, 111, and 112 compose the top pin (nip) semiconductor junction 13.

In a preferred embodiment of the present invention, the top pin semiconductor junction is a semiconductor junction having the least deterioration rate and an absorption spectrum set on the short wavelength side, and the bottom pin semiconductor junction is a semiconductor junction having the greatest deterioration rate and an absorption spectrum set on the long wavelength side. In this example, the peak of the absorption spectrum of the semiconductor junction with the least deterioration rate is set at a wavelength of not more than 500 nm, and the peak of the absorption spectrum of the semiconductor junction with the greatest deterioration rate at a wavelength of not less than 700 nm.

Another semiconductor junction having an intermediate deterioration rate can be provided as the middle pin semiconductor junction 12 between the semiconductor junction with the least deterioration rate and the semiconductor junction with the greatest deterioration rate. The peak of the absorption spectrum of this semiconductor junction with the intermediate deterioration rate is set in a range of wavelengths from 500 nm to 700 nm.

In a preferred embodiment of the present invention, the i-type semiconductor layer of the top pin semiconductor junction is preferably made using deposition of a relatively slow deposition rate by plasma enhanced CVD with the power of the high frequency such as the radio frequency. In the same preferred embodiment, the i-type semiconductor layer of the bottom pin semiconductor junction is made using deposition of a relatively fast deposition rate by plasma enhanced CVD using microwave.

Anti-reflection Layer 113

The anti-reflection layer 113 also serves as an upper electrode opposite to the substrate through the above semiconductor layers 104 to 112. The anti-reflection layer 113 can be made of a raw material selected from indium oxide, tin oxide, titanium oxide, zinc oxide, and mixtures thereof by vacuum vapor deposition with resistance heating or electron beam, sputtering, CVD, spraying, immersion plating, or the like. In order to achieve the good anti-reflection effect at the light incident surface 118, the thickness of the anti-reflection layer is preferably about a value obtained by dividing the wavelength of light desired to be mainly prevented from being reflected by four times the refractive index of the anti-reflection film. For example, if the refractive index is 2 and the wavelength most desired to be transmitted is 500 nm, the thickness is desirably about 63 nm. The anti-reflection layer may be a lamination of different-index materials.

In the preferred example of the present invention, the photoelectric conversion element is integrally constructed of the lower electrode, semiconductor junctions, and upper electrode, but the photoelectric conversion element of the present invention is not limited to the above-stated structure.

Electrode 114

In order to efficiently collect the electric current, an electrode 114 of a grid pattern may be provided on the anti-reflection layer 113. Methods for forming the electrode 114 include sputtering using a mask pattern, resistance heating, CVD, evaporating a metal film over the entire surface and thereafter patterning the film to remove unnecessary portions by etching, directly forming the grid electrode pattern by photo-assisted CVD, forming a mask of a negative pattern of the grid electrode pattern and thereafter performing plating thereon, and printing a conductive paste.

After this, the output terminals may be attached to the substrate 101 and to the electrode 114, if necessary, in order to take the electromotive force out.

Surface Encapsulating Material 116

The surface encapsulating material 116 is necessary for covering the unevenness of the photoelectric conversion element with a resin, for protecting the photoelectric conversion element from severe external circumstances such as temperature change, humidity, and impact, and for securing adhesion between the surface film and the photoelectric conversion element. Therefore, it needs to be excellent in weather resistance, adhesion, filling property, heat resistance, low temperature resistance, and impact resistance. Resins meeting these requirements include polyolefin-based resins such as ethylene-vinyl acetate copolymers (EVA), ethylene-methylacrylate copolymers (EMA), ethylene-ethylacrylate copolymers (EEA), and polyvinyl butyral resins, urethane resins, silicone resins, and fluororesins. Among them, EVA is preferably used, because it has well-balanced physical properties for use in a solar cell. However, if not crosslinked it readily undergoes deformation or creep under use at high temperature due to its low thermal deformation temperature. Thus, it is preferably crosslinked in order to enhance heat resistance. In the case of EVA, it is usually crosslinked with an organic peroxide. The crosslinking with the organic peroxide is made in such a way that free radicals produced from the organic peroxide draw hydrogen and halogen atoms in the resin to form C—C bonds. Known methods for activating the organic peroxide include thermal decomposition, redox decomposition, and ion decomposition. In general, the thermal decomposition method is favorably adopted. Specific examples of the organic peroxide include hydroperoxide, dialkyl (allyl) peroxide, diacyl peroxide, peroxy ketal, peroxy ester, peroxy carbonate, ketone peroxide, and so on. An amount of the organic peroxide added is 0.5 to 5 parts by weight per 100 parts by weight of the encapsulating resin.

When the above organic peroxide is used in the encapsulating material 116, crosslinking and thermocompression bonding can be achieved under heat and pressure in a vacuum. The heating temperature and period can be determined depending upon the thermal decomposition temperature characteristics of the respective organic peroxides. In general, the heat and pressure is stopped at the temperature and time where the thermal decomposition reaches 90%, more preferably, not less than 95%. The degree of crosslinking of the encapsulating resin can be checked by measuring a gel percentage. In order to prevent deformation of the encapsulating resin under high temperature, the crosslinking of the encapsulating resin should be done preferably so that the gel percentage becomes not less than 70 wt %.

For efficiently carrying out the above crosslinking reaction, triallyl isocyanurate (TAIC), called a crosslinking assistant, can also be used. An amount of the crosslinking assistant added is normally in the range of 1 part by weight to 5 parts by weight, both inclusive per 100 parts by weight of the encapsulating resin.

The encapsulating material used in the present invention is excellent in weather resistance, but an ultraviolet absorbing agent may also be added in order to further enhance weather resistance or in order to protect the layer located below the encapsulating material. The ultraviolet absorbing agent can be selected from well-known compounds and is selected preferably from low-volatility ultraviolet absorbing agents in consideration of use environments of the solar cell module. Specific examples of such agents are various organic compounds including salicylic acid-based compounds, benzophenone-based compounds, benzotriazole-based compounds, and cyanoacrylate-based compounds.

If a light stabilizer is also added together with the ultraviolet absorbing agent, the encapsulating material will become more stable to light. Typical examples of the light stabilizer are hindered amine-based light stabilizers. The hindered amine-based light stabilizers do not absorb the ultraviolet light, different from the ultraviolet absorbing agent, but they demonstrate a great synergistic effect when used with the ultraviolet absorbing agent.

Contents of the above ultraviolet absorbing agent and light stabilizer added are preferably between 0.1 and 1.0 wt % and between 0.05 and 1.0 wt %, respectively, of the encapsulating resin.

Further, a thermal oxidation inhibitor may be added for improving the thermal resistance and thermal processability. The chemical structure of the thermal oxidation inhibitor may be monophenol-based, bisphenol-based, polymer-type-phenol-based, sulfur-based, or phosphoric-acid-based. A content of the thermal oxidation inhibitor added is preferably between 0.05 and 1.0 wt % of the encapsulating resin.

It is preferable to enhance the adhesive strength between the encapsulating resin and the photoelectric conversion element or the surface resin film if the photoelectric conversion element is assumed to be used under severe circumstances. A silane coupling agent or an organic titanate compound can be added to the encapsulating resin for further enhancing adhesive strength. An amount of the additive is preferably between 0.1 and 3 parts by weight, both inclusive, and more preferably between 0.25 and 1 part by weight, both inclusive per 100 parts by weight of the encapsulating resin.

On the other hand, the surface encapsulating material 116 needs to be transparent in order to prevent a decrease in the quantity of light reaching the photoelectric conversion element as much as possible. Specifically, the optical transmittance thereof is preferably 80% or more, and more preferably 90%, or more in the visible light wavelength region of 400 nm inclusive to 800 nm inclusive. For facilitating incidence of light from the atmosphere, the refractive index of the encapsulating material at 25° C. is preferably 1.1 to 2.0, and more preferably 1.1 to 1.6. A specific example of a transmission spectrum is shown in FIG. 5, and the transmittance is desirably 0 to 90% in the wavelength range of 300 nm to 400 nm.

Surface Film 117

Since the surface resin film 117 employed in the present invention is located as the outermost layer of the solar cell module, it needs to have the ability to secure long-term reliability in outdoor exposure of the solar cell module, as well as weather resistance, pollution resistance, and mechanical strength. Materials suitably used for the surface film in the present invention are, for example, fluororesins and acrylic resins. Among them, fluoride polymers are favorably used, because they are excellent in weather resistance and pollution resistance. Specific examples include polyvinylidene fluoride resins, polyvinyl fluoride resins, and tetrafluoroethylene-ethylene copolymers. The polyvinylidene fluoride resins are excellent in terms of weather resistance, while the tetrafluoroethylene-ethylene copolymers are excellent in terms of balancing weather resistance, mechanical strength, and transparency.

The surface resin film 117 needs to have some thickness for attaining mechanical strength, but too great thicknesses are not preferred from the viewpoint of cost. Specifically, the thickness is preferably between 20 $\mu$m and 200 $\mu$m, both inclusive, and more preferably between 30 $\mu$m and 100 $\mu$m, both inclusive.

For improving the adhesion between the surface resin film 117 and the encapsulating material 116, one surface of the surface resin film should be preferably treated by a surface treatment such as corona treatment, plasma treatment, ozone treatment, UV irradiation, electron beam irradiation, or flame treatment. Among them, corona discharge treatment is preferably used, because its treatment rate is fast, and it can increase the adhesive strength greatly by a relatively simple device.

The unevenness is formed in the surface resin film 117 and surface encapsulating material 116. This unevenness may be provided during the cover forming step or may be formed by a method such as pressing after formation of the cover.

Back Surface Material 115

The cover film used as a specific example of the back surface material is necessary for maintaining electrical insulation between the conductive substrate of the photoelectric conversion element and the outside. Preferred materials are those capable of securing sufficient electrical insulation to the conductive substrate 101, excellent in long-term durability, resistant to thermal expansion and thermal contraction, and exhibiting flexibility. Suitably applicable films are films of polyamides and polyethylene terephthalate.

In order to increase the mechanical strength of solar cell module or in order to prevent distortion or warpage due to temperature change, the back surface material may be selected, for example, from steel sheets, plastic sheets, and FRP (glass fiber reinforced plastics) sheets, as well as the above-stated cover films. When the back surface material has high mechanical strength, the solar cell module can be applied to building materials such as roof materials.

Figure 11:
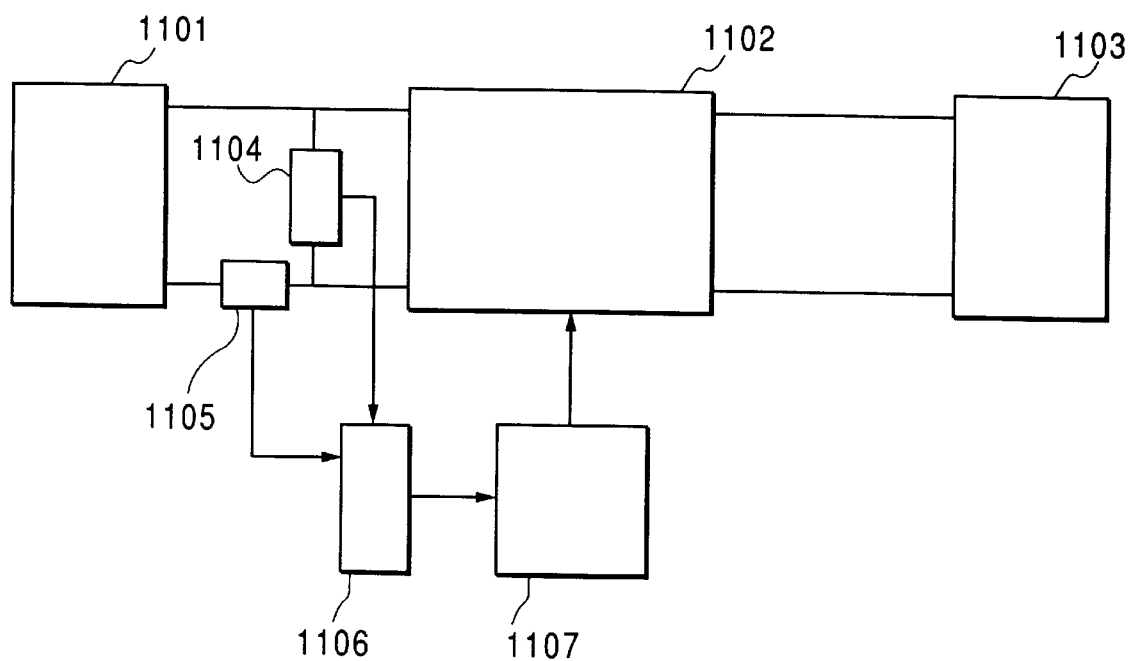
FIG. 11 is a drawing to show a power generation apparatus according to the present invention.

FIG. 11 shows an example of an electric power generation apparatus using the power control method of the present invention. The DC output of solar battery 1101 is put into power converting device 1102 and then supplied to load 1103.

The solar cell module of FIG. 1 as described previously can be used for the solar battery 1101. Such modules are connected in series or in parallel to form a solar cell array, thereby obtaining desired voltage and current.

The power converting device 1102 may be a DC/DC converter using a self-turn-off switching device such as a power transistor, a power FET, or an IGBT, or a self-excited DC/AC inverter, or the like. When the power converting device is either one of them, the power flow, input/output voltages, output frequency, etc. can be controlled by the ON/OFF duty ratio (so called the conduction ratio) and the frequency of gate pulse.

The load 1103 may include various loads including electric heating loads, motor loads, etc., but it may be the commercial AC system in the case of alternating current. When the load is the commercial AC system, the system is called a "system-interconnected solar power generation system." Since the load is the power system in this case, there is no limit on the power that can be put thereinto. The control method of the present invention for supplying the maximum power from the solar battery or the like is particularly preferable for such as a system. Similarly, a secondary battery can also be used as a DC load. A desired arrangement in that case is such that the capacity of the secondary battery is designed to be as large as possible and the charged state of the battery is managed. When the load is DC, the power converting device 1102 is a DC/DC converter.

The output voltage and output current of the solar battery 1101 are detected by voltage detecting device 1104 and current detecting device 1105, and detected signals thereof are supplied to output voltage setting device 1106 for setting the output voltage of the solar battery.

The voltage detecting device 1104 divides a voltage from the output voltage of the solar battery by resistor and performs A/D conversion to convert the divided voltage to a digital value. Then the voltage detecting device 1104 sends the digital value to control device 1107 of the output voltage setting device 1106. On this occasion, in order to avoid mixing of noise or the like, the output circuit of the solar battery is desirably insulated from the detected signal transmitting circuit, for example, by a photocoupler capable of perfect insulation between input and output. In a preferred arrangement, the current detecting device 1105 converts a current to a voltage by a Hall-effect device or a standard resistor converts a detected signal to a digital value, similar to the voltage detecting device 1104, and sends the digital value to the voltage setting device 1106. The A/D converters used in these detecting devices are preferably those having sufficiently high speed and high accuracy. Specifically, they are preferably those having a resolution of not less than 10 bits and a sampling rate of not less than 50 kHz. The A/D converter of this type can constitute a control system having a error of not more than 0.1% and a response of not more than 1 sec.

The output voltage setting device 1106 performs an arithmetic based on the above detected signals to determine a set value of output voltage and controls the conduction ratio or the like of the gate circuit of the power converting device so that the output voltage of the solar battery becomes the set value. The output voltage setting device 1106 is embodied as a microcomputer for control, which can be provided with CPU, RAM, ROM, I/O ports, a numeric computing unit, and so on.

The controlling device 1107 of the power converting device is a so-called gate driving circuit, and generates a gate pulse by instantaneous current comparison, sine-wave/delta-wave comparison method, or the like. By this, the conduction ratio of the power converting device 1102 is controlled so that the output voltage of the solar battery becomes equal to the output of the output voltage setting device 1106. This control device 1107 may be configured as an analog circuit or a digital circuit, but most of the recent control units are digital units, which have the CPU or DSP (Digital Signal Processor) being a high-speed CPU.

When the control device 1107 is a digital unit, it has a configuration similar to the aforementioned output voltage setting device 1106, and thus the control device 1107 can also be arranged to serve as the output voltage setting device 1106.

The present invention will be further described with examples.

EXAMPLES

Example 1

In the present example, as described below in detail, the photoelectric conversion element having the structure shown in the cross-sectional, schematic view of FIG. 1, was produced in the batch method, and the protection member to absorb the ultraviolet light was provided. The semiconductor junction with the best characteristics was the one produced on the top surface side and corresponding to the ultraviolet light, and the i-layer 111 thereof was made by RF-CVD process. The i-layers (105, 108) of the middle and bottom junctions were made by microwave-CVD.

The substrate 101 was a sheet of SUS430 45 mm long×45 mm wide and 0.15 mm thick and having a roughened surface generally referred to as dull finish. Eight substrates were produced in the same manner. The eight substrates were simultaneously set in a commercially available DC magnetron sputtering system, and the inside thereof was evacuated down to a pressure of below $10^{-5}$ Torr. After that, argon gas was supplied at 30 sccm and the pressure was maintained at 2 mTorr. Without heating the substrates, a reflective layer of aluminum was formed thereon in a thickness of 70 nm by applying the DC power of 120 W to a 6-inch-φ aluminum target for 90 seconds. Subsequently, the substrates were heated to the temperature of 300° C., the electric connection was switched to a target of zinc oxide having a diameter of 6 inches, and a DC power of 500 W was applied thereto for 10 minutes, thereby producing the resistive layer of zinc oxide in the thickness of about 1000 nm. The unevenness of about 300 nm was formed in the surface of the resistive layer.

Each of these samples was set in the delivery chamber 201 of the apparatus schematically shown in FIG. 2, the delivery chamber was evacuated to $10^{-4}$ Torr by the vacuum pump, thereafter the gate valve was opened, and then the substrate was moved to the n-layer deposition chamber 202. The substrate holder 212 was lowered, and the surface temperature of the substrate was maintained at 250° C. by the heater 208. After completion of sufficient evacuation, the source gases were introduced through the gas inlet pipe 220 and at 1 sccm of $Si_2H_6$, 0.5 sccm of $PH_3/H_2$ (1% dilution with $H_2$), and 40 sccm of $H_2$. Controlling the valve travel of the throttle valve, the internal pressure of the reactor was maintained at 1 Torr. Power of 3 W was supplied from the high-frequency power supply immediately after the pressure became stable. The plasma was maintained for 180 seconds. This resulted in forming the n-type a-Si layer 104 on the transparent, resistive layer 103. The chamber was again evacuated, and thereafter the substrate was transferred to the microwave i-layer deposition chamber 203. The temperature of substrate was set at 250° C., and the source gases were introduced through the gas inlet pipe 221 and at 40 sccm of $SiH_4$, 50 sccm of $GeH_4$, and 200 sccm of $H_2$. Controlling the valve travel of the throttle valve, the internal pressure of the reactor was maintained at 1.5 mTorr. Immediately after the pressure became stable, a power of 150 W was supplied from the 105 MHz-microwave power supply, while a power 800 W of the high frequency of 13.56 MHz was applied to the bias electrode for fifteen seconds. This resulted in forming the i-type a-SiGe layer 105. The chamber was again evacuated, and then the substrate was transferred to the p-layer deposition chamber 204. The substrate temperature was set at 250° C., and the source gases were introduced through the gas inlet pipe 222 and at 0.5 sccm of $SiH_4/H_2$ (10% dilution with $H_2$), 1 sccm of $BF_3/H_2$ (1% dilution with $H_2$), and 50 sccm of $H_2$. Controlling the valve travel of the throttle valve, the internal pressure of the reactor was maintained at 1 Torr. A power of 200 W was supplied from the high-frequency power supply immediately after the pressure became stable. The plasma was maintained for 120 seconds. This resulted in forming the p-type μc-Si layer 106.

Then the substrate was moved again to the n-layer deposition chamber 202. The surface temperature of the substrate was maintained at 230° C. by the heater 208. After the inside was evacuated sufficiently, the source gases were introduced through the gas inlet pipe 220 and at 1 sccm of $Si_2H_6$, 0.5 sccm of $PH_3/H_2$. (1% dilution with $H_2$), and 40 sccm of $H_2$. Controlling the valve travel of the throttle valve, the internal pressure of the reactor was maintained at 1 Torr. A power of 3 W was supplied from the high-frequency power supply immediately after the pressure became stable. The plasma was maintained for 180 seconds. This resulted in forming the n-type a-Si layer 107. The inside of the chamber was evacuated again, and thereafter the substrate was transferred to the microwave i-type deposition chamber 203. The substrate temperature was set at 230° C., and the source gases were introduced through the gas inlet pipe 221 and at 40 sccm of $SiH_4$, 40 sccm of $GeH_4$, and 200 sccm of $H_2$. Controlling the valve travel of the throttle valve, the internal pressure of the reactor was maintained at 1.5 mTorr. Immediately after the pressure became stable, a power of 150 W was supplied from the microwave power supply, while a high-frequency power of 800 W was applied to the bias electrode for 15 seconds. This resulted in forming the i-type a-SiGe layer 108. The chamber was evacuated again, and thereafter the substrate was transferred to the p-layer deposition chamber 204. The substrate temperature was set at 230° C., and the source gases were introduced through the gas inlet pipe 222 and at 0.5 sccm of $SiH_4/H_2$ (10% dilution with $H_2$), 1 sccm of $BF_3/H_2$ (1% dilution with $H_2$), and 50 sccm of $H_2$. Controlling the valve travel of the throttle valve, the internal pressure of the reactor was maintained at 1 Torr. A power of 200 W was supplied from the high-frequency power supply immediately after the pressure became stable. The plasma was maintained for 120 seconds. This resulted in forming the p-type $\mu$c-Si layer 109.

Then the substrate was moved again to the n-layer deposition chamber 202. The surface temperature of substrate was maintained at 200° C. by the heater 208. After the inside was evacuated sufficiently, the source gases were introduced through the gas inlet pipe 220 and at 1 sccm of $Si_2H_6$, 0.5 sccm of $PH_3/H_2$ (1% dilution with $H_2$), and 40 sccm of $H_2$. Controlling the valve travel of the throttle valve, the internal pressure of the reactor was maintained at 1 Torr. A power of 3 W was supplied from the high-frequency power supply immediately after the pressure became stable. The plasma was maintained for 180 seconds. This resulted in forming the n-type a-Si layer 110. The inside of the chamber was evacuated again, and thereafter the substrate was transferred to the high-frequency i-layer deposition chamber 205. The substrate temperature was set at 200° C., and the source gases were introduced through the gas inlet pipe 223 and at 1 sccm of $Si_2H_6$ and 40 sccm of $H_2$. Controlling the valve travel of the throttle valve, the internal pressure of the reactor was maintained at 1 Torr. Immediately after the pressure became stable, a power of 2 W was supplied from the high-frequency power supply, and the discharge was maintained for 600 seconds. This resulted in forming the i-type a-Si layer 111. The chamber was evacuated again, and thereafter the substrate was transferred to the p-layer deposition chamber 204. The substrate temperature was set at 200° C., and the source gases were introduced through the gas inlet pipe 222 and at 0.5 sccm of $SiH_4/H_2$ (10% dilution with $H_2$), 1 sccm of $BF_3/H_2$ (1% dilution with $H_2$), and 50 sccm of $H_2$. Controlling the valve travel of the throttle valve, the internal pressure of the reactor was maintained at 1 Torr. A power of 200 W was supplied from the high-frequency power supply immediately after the pressure became stable. The plasma was maintained for 2 minutes. This resulted in forming the p-type $\mu$c-Si layer 112.

Then the sample was taken out of the apparatus of FIG. 2 and was attached to the surface of the anode of the DC magnetron sputtering apparatus. A stainless steel mask was used as a shield around the sample, and the transparent, conductive layer 113 was made in the central area of 40 mm×40 mm by sputtering with a target of 10 wt % tin oxide and 90 wt % indium oxide. The deposition was conducted under the following conditions: the substrate temperature 200° C.; the flow rate of argon as inert gas 50 sccm; the flow rate of oxygen gas 0.5 sccm; the pressure in the deposition chamber 3 mTorr; the input energy per unit area of target 0.2 $W/cm^2$; the thickness of the layer 70 nm after deposition for about 100 seconds. The thickness of the layer was determined in such a way that the relation was preliminarily calibrated between the thickness and deposition time under the same conditions, and the deposition was terminated at the time to achieve the predetermined thickness.

A silver paste was screen-printed on each of the samples produced as described above to form the electrode in the 2% region of the area. Finally, a copper tab was bonded as a negative terminal to the stainless steel substrate with a stainless steel solder, and a tape of tin foil as a positive terminal was bonded to the electrode 114 with a conductive adhesive, thus forming the output terminals. The positive terminal was routed through an insulator to the bottom surface so that the output was able to be taken out through a hole in the back covering material as described below.

For four samples out of the eight samples produced up to the formation of the output electrodes of photoelectric conversion element, characteristics without the protection member were measured, and they were named as Comparative Example 1-1 described below. In the present example the four remaining samples were covered by the following method.

An EVA sheet (trade name: PHOTOCAP, the thickness 460 $\mu$m, available from SPRINGBORN LABORATORIES INC.) and a non-oriented ETFE film one surface of which was corona-discharge-treated (trade name: TEFZEL film, the thickness 50 $\mu$m, available from DuPont Inc.) were stacked on the light receiving surface side of the photoelectric conversion section, and an EVA sheet (trade name: PHOTOCAP, the thickness 460 $\mu$m, available from SPRINGBORN LABORATORIES INC.), a polyamide film (trade name: Dertec, the thickness 63.5 $\mu$m, available from DuPont Inc.), and Galvalume (galvanized iron sheet, the thickness 0.27 mm) were stacked on the bottom side. They were stacked in the order of ETFE/EVA/photoelectric conversion section/EVA/polyamide/EVA/steel sheet. On this occasion, an aluminum mesh (16×18 meshes, the diameter of line 0.011 inch) was placed through a fluorocarbon film for release (trade name: Teflon PFA film, the thickness 50 $\mu$m, available from DuPont Inc.) for excessive EVA outside of the ETFE. This lamination was heated at 150° C. for 30 minutes while degassing under pressure with a vacuum laminator, thereby obtaining the photoelectric conversion element, the surface of which was roughened by the aluminum mesh. The EVA sheet used herein is the one popularly used as an encapsulating material of a solar cell, in which 1.5 parts by weight of the crosslinking agent, 0.3 part by weight of the ultraviolet absorbing agent, 0.1 part by weight of the light stabilizer, 0.2 part by weight of the thermal oxidation inhibitor, and 0.25 part by weight of the silane coupling agent are blended per 100 parts by weight of the EVA resin (the content of vinyl acetate: 33%). The output terminals were preliminarily routed to the bottom surface of photovoltaic element so that the output was able to be taken out through the terminal output port preliminarily formed in the Galvalume sheet after the lamination process. Then the protection resin was bonded to the samples, thus completing the photoelectric conversion elements.

The absorption spectra of the four photoelectric conversion elements thus completed are shown in FIG. 6. It is seen that the absorption spectra show the decrease due to absorption by the protection member in the range of 300 nm to 370 nm. Photo-currents generated by the top, middle, and bottom semiconductor junctions at this time were 7.3±0.1 $mA/cm^2$, 7.6±0.1 $mA/cm^2$, and 8.0±0.1 $mA/cm^2$, respectively. The fill factors obtained from voltage-current characteristics under irradiation of AM 1.5 (100 mW/cm$^2$) were 0.72±0.01, and initial conversion efficiencies were 10.2±0.1%, which were slightly lower than 10.4±0.1 of the samples (Comparative Example 1-1) before formation of the protection member. However, conversion efficiencies after the deterioration test of 4000 hours under AM 1.5 (100 mW/cm$^2$) were 8.7±0.1%, which were higher than 8.3% of Comparative Example 1-1 without the protection member. The photo-currents after the deterioration test were as follows: top 7.2±0.1 mA/cm$^2$; middle 7.3±0.1 mA/cm$^2$; bottom 7.8±0.1 mA/cm$^2$. Thus, the change in the photo-current of the top semiconductor junction was the smallest, so that the top semiconductor junction was the one with the best characteristics. After the change, the top semiconductor junction with the best characteristics also maintained the smallest photo-current.

Samples each having only one single semiconductor junction, and samples in which only the i-layers were thicker were also produced and their fill factor, spin density, and carrier transit mobility were also measured. They were the same as the values described above.

Further, these samples were subjected to the environment test for 1000 hours in an environmental test box kept at 85° C. and a humidity of 85%. The change of conversion efficiency was only 0.02% decrease, and thus there was no problem at all.

Comparative Example 1-1

The characteristics of four of the eight samples produced in Example 1 prior to the formation of the output electrodes were measured without the protection member, and their absorption spectra are shown in FIG. 4. The light is utilized in the wide range of 300 nm to 900 nm. The photo-currents generated by the top, middle, and bottom semiconductor junctions at this time were 7.6±0.1 mA/cm$^2$, 7.4±0.1 mA/cm$^2$, and 7.8±0.1 mA/cm$^2$, respectively. The fill factors obtained from voltage-current characteristics under irradiation of AM 1.5 (100 mW/cm$^2$) were 0.70±0.01, and the initial conversion efficiencies were 10.4±0.1%. The conversion efficiencies after the deterioration test of 4000 hours under AM 1.5 (100 mW/cm$^2$) without the protection member were 8.3±0.1%. There is little difference depending upon the substrates, and it is thus considered that the four remaining samples also show the same characteristics.

The photoelectric conversion elements without the protection member were easily broken in outdoor use, and particularly, when they were soaked by rain, they were damaged due to leakage of electricity from the electrode.

Comparative Example 1-2

The photoelectric conversion element was produced by the same method as in Example 1 except that during formation of the i-type a-Si layer 111 in the high-frequency i-layer deposition chamber 205, the discharge was maintained for 660 seconds in this comparative example, different from 600 seconds in Example 1.

The photo-currents of the top, middle, and bottom semiconductor junctions, that were able to be measured from the absorption spectra before formation of the protection member, were 7.9 mA/cm$^2$, 7.4 mA/cm$^2$, and 7.8 mA/cm$^2$, respectively.

The photo-currents of the respective junctions after formation of the protection member were 7.6 mA/cm$^2$, 7.6 mA/cm$^2$, and 8.0 mA/cm$^2$. The fill factor obtained from voltage-current characteristics under irradiation of AM 1.5 (100 mA/cm$^2$) was 0.67. The initial conversion efficiency was 9.9%, and the conversion efficiency after the deterioration test of 400 hours under AM 1.5 (100 mW/cm$^2$) was 7.4%. Since in this example the photo-currents of the two top and center semiconductor junctions are equal, the fill factor is decreased considerably. The photo-currents of the respective junctions after the deterioration test were 7.5 mA/cm$^2$, 7.2 mA/cm$^2$, and 7.7 mA/cm$^2$. Thus the photo-current of the middle semiconductor junction was the smallest.

Example 2

In this example, a middle-dominated triple cell was produced. Namely, the middle i-layer 108 was made by the RF-CVD process, and the other i-layers 105, 111 were made by the microwave-CVD process. The layers up to the n-type a-Si layer 107 in the middle semiconductor junction were produced by the same method as in Example 1.

After that, the substrate was transferred to the high-frequency i-layer deposition chamber 205. The substrate temperature was set at 230° C., and the source gases were introduced through the gas inlet pipe 223 and at 2 sccm of SiH$_4$, 2 sccm of GeH$_4$, and 40 sccm of H$_2$. Controlling the valve travel of the throttle valve, the internal pressure of the reactor was maintained at 1 Torr. Immediately after the pressure became stable, a power of 2 W was supplied from the high-frequency power supply, and the discharge was maintained for 600 seconds. This resulted in forming the i-type a-SiGe layer 108. The chamber was evacuated again, and thereafter the substrate was transferred to the p-layer deposition chamber 204. The substrate temperature was set at 230° C., and the source gases were introduced through the gas inlet pipe 222 and at 0.5 sccm of SiH$_4$/H$_2$ (10% dilution with H$_2$), 1 sccm of BF$_3$/H$_2$ (1% dilution with H$_2$), and 50 sccm of H$_2$. Controlling the valve travel of the throttle valve, the internal pressure of the reactor was maintained at 1 Torr. A power of 200 W was supplied from the high-frequency power supply immediately after the pressure became stable. The plasma was maintained for 120 seconds. This resulted in forming the p-type $\mu$c-Si layer 109.

Then the substrate was moved again to the n-layer deposition chamber 202. The surface temperature of substrate was maintained at 200° C. by the heater 208. After the inside was evacuated sufficiently, the source gases were introduced through the gas inlet pipe 220 and at 1 sccm of Si$_2$H$_6$, 0.5 sccm of PH$_3$/H$_2$ (1% dilution with H$_2$), and 40 sccm of H$_2$. Controlling the valve travel of the throttle valve, the internal pressure of the reactor was maintained at 1 Torr. A power of 3 W was supplied from the high-frequency power supply immediately after the pressure became stable. The plasma was maintained for 180 seconds. This resulted in forming the n-type a-Si layer 110. The inside of the chamber was evacuated again, and thereafter the substrate was transferred to the microwave i-type deposition chamber 203. The substrate temperature was set at 200° C., and the source gases were introduced through the gas inlet pipe 221 and at 60 sccm of SiH$_4$, 10 sccm of GeH$_4$, and 200 sccm of H$_2$. Controlling the valve travel of the throttle valve, the internal pressure of the reactor was maintained at 1.5 mTorr. Immediately after the pressure became stable, a power of 150 W was supplied from the 105 MHz-microwave power supply, while the 13.56 MHz-high-frequency power of 800 W was applied to the bias electrode for 15 seconds. This resulted in forming the i-type a-SiGe layer 111. The chamber was evacuated again, and thereafter the substrate was transferred to the p-layer deposition chamber 204. The substrate temperature was set at 200° C., and the source gases were introduced through the gas inlet pipe 222 and at 0.5 sccm of SiH$_4$/H$_2$ (1% dilution with H$_2$), 1 sccm of BF$_3$/H$_2$ (1% dilution with H$_2$), and 50 sccm of H$_2$. Controlling the valve travel of the throttle valve, the internal pressure of the reactor was maintained at 1 Torr. A power of 200 W was supplied from the high-frequency power supply immediately after the pressure became stable. The plasma was maintained for 120 seconds. This resulted in forming the p-type μc-Si layer 112.

After the above, the photoelectric conversion element was produced by the same method as in Example 1.

The photo-currents of the top, middle, and bottom semiconductor junctions, that were able to be measured from the absorption spectra before formation of the protection member, were 7.9 mA/cm$^2$, 7.5 mA/cm$^2$, and 7.6 mA/cm$^2$, respectively.

The photo-currents of the respective junctions after formation of the protection member were 7.6 mA/cm$^2$, 7.3 mA/cm$^2$, and 7.8 mA/cm$^2$. The fill factor obtained from voltage-current characteristics under irradiation of AM 1.5 (100 mA/cm$^2$) was 0.70. The initial conversion efficiency was 10.3% and the conversion efficiency after the deterioration test of 4000 hours under AM 1.5 (100 mW/cm$^2$) was 8.6%. The photo-currents after the deterioration test were as follows: top 7.2 mA/cm$^2$; middle 7.1 mA/cm$^2$; bottom 7.4 mA/cm$^2$. Thus, the change in the photo-current of the middle semiconductor junction was the smallest, so that the middle semiconductor junction was the one with the best characteristics. After the change, the photo-current of the middle semiconductor junction with the best characteristics was also the smallest.

Further, this sample was subjected to the environment test for 1000 hours in the environmental test box maintained at 85° C. and a humidity of 85%. The conversion efficiency decreased only 0.01%, and thus there was no problem at all.

Comparative Example 2

The photoelectric conversion element was produced by the same method as in Example 2 except that during formation of the i-type a-SiGe layer 111 in the microwave i-layer deposition chamber 203, the period of the discharge was reduced to 13 seconds in this comparative example from 15 seconds in Example 2.

The photo-currents of the top, middle, and bottom semiconductor junctions, that were able to be measured from the absorption spectra before formation of the protection member, were 7.5 mA/cm$^2$, 7.5 mA/cm$^2$, and 7.7 mA/cm$^2$, respectively.

The photo-currents of the respective junctions after formation of the protection member were 7.2 mA/cm$^2$, 7.6 mA/cm$^2$, and 7.8 mA/cm$^2$. The fill factor obtained from voltage-current characteristics under irradiation of AM 1.5 (100 mA/cm$^2$) was 0.68. The initial conversion efficiency was 9.8%, and the conversion efficiency after the deterioration test of 4000 hours under AM 1.5 (100 mW/cm$^2$) was 7.3%, which was considerably lower than that in Example 2.

Example 3

In some cases, a roof material is given a color tone such as red due to aesthetics. In such cases, the protection member may be colored, but an easier way is to control the color tone by the thickness of the transparent, conductive layer. This example is an example in which the thickness of the transparent, conductive layer is decreased to increase reflection of long-wavelength light, whereby the photo-currents in the semiconductor junctions are adjusted therewith. In this example, a top-dominated triple cell was also produced as in Example 1.

The photoelectric conversion element in Example 1 was produced in such a manner that the production time of the i-layer 105 of the bottom semiconductor junction was 15 sec, the production time of the i-layer 108 of the middle semiconductor junction was also 15 sec, the production time of the i-layer 111 of the top semiconductor junction was 600 sec, and the transparent, conductive layer was produced in a thickness of 70 nm with a production time of 100 sec. The photoelectric conversion element of the present example was produced by the same method as in Example 1 except that therein the production time of the i-layer 105 of the bottom semiconductor junction was 17 sec, the production time of the i-layer 108 of the middle semiconductor junction was also 17 sec, the production time of the i-layer 111 of the top semiconductor junction was 570 sec, and the transparent, conductive layer was produced in a thickness of 50 nm with a production time of 71 sec.

The photo-currents of the top, middle, and bottom semiconductor junctions, that were able to be measured from the absorption spectra before formation of the protection member, were 7.8 mA/cm$^2$, 7.2 mA/cm$^2$, and 7.6 mA/cm$^2$, respectively.

The photo-currents of the respective junctions after formation of the protection member were 7.2 mA/cm$^2$, 7.5 mA/cm$^2$, and 7.9 mA/cm$^2$, and thus the cell was a top-dominated one. A fill factor obtained from voltage-current characteristics under irradiation of AM 1.5 (100 mA/cm$^2$) was 0.72. The initial conversion efficiency was 10.3%, and the conversion efficiency after the deterioration test of 4000 hours under AM 1.5 (100 mW/cm$^2$) was 8.7%. The photo-currents after the deterioration test were as follows: top 7.1 mA/cm$^2$; middle 7.2 mA/cm$^2$; bottom 7.7 mA/cm$^2$. Thus, the change in the photo-current of the top semiconductor junction was the smallest, so that the top semiconductor junction was the one with the best characteristics. After the change, the photo-current of the top semiconductor junction with the best characteristics was also the smallest.

Further, this sample was subjected to the environment test for 1000 hours in the environmental test box maintained at 85° C. and a humidity of 85%. The conversion efficiency decreased only 0.01%, and thus there was no problem at all.

Comparative Example 3

The photoelectric conversion element was produced by the same method as in Example 1 except that the transparent, conductive layer was produced in a thickness of 50 nm with a production time of 71 sec.

The photo-currents of the top, middle, and bottom semiconductor junctions, that were able to be measured from the absorption spectra before formation of the protection member, were 7.9 mA/cm$^2$, 7.0 mA/cm$^2$, and 7.4 mA/cm$^2$, respectively.

The photo-currents of the respective junctions after formation of the protection member were 7.3 mA/cm$^2$, 7.3 mA/cm$^2$, and 7.7 mA/cm$^2$. The fill factor obtained from voltage-current characteristics under irradiation of AM 1.5 (100 mA/cm$^2$) was 0.66. The initial conversion efficiency was 9.5% and the conversion efficiency after the deterioration test of 4000 hours under AM 1.5 (100 mW/cm$^2$) was 7.2%. The photo-currents after the deterioration test were as follows: top 7.2 mA/cm$^2$; middle 6.9 mA/cm$^2$; bottom 7.5 mA/cm$^2$. Thus, the change in the photo-current of the top semiconductor junction was the smallest, so that the top semiconductor junction was the one with the best characteristics. However, the middle semiconductor junction showed a minimum photo-current, thereby greatly decreasing the efficiency.

Example 4

The substrate was a large 24 cm×35 cm substrate. The photoelectric conversion element was produced by the same method as in Example 1 except that the element was made using an apparatus scaled up so as to process a large substrate. In this case, a distribution of thicknesses was observed at the longitudinal edges because of deviation of the setting position of the opposite electrode in the deposition chamber for producing the i-layer of the top semiconductor junction by the high-frequency method. It was possible to eliminate the distribution by adjustment of the apparatus, but the layer was produced without adjustment of apparatus.

When the protection member was formed, a pressing plate, two quarters of the central portion of which were convex, was placed thereon, whereby both ends of the protection member were made thicker to about 500 µm.

The photo-currents of the top, middle, and bottom semiconductor junctions, that were able to be measured from the absorption spectra before formation of the protection member, were 7.4 mA/cm$^2$, 7.2 mA/cm$^2$, and 7.6 mA/cm$^2$, respectively.

The photo-currents of the respective junctions after formation of the protection member were 7.1 mA/cm$^2$, 7.4 mA/cm$^2$, and 7.9 mA/cm$^2$. The fill factor obtained from voltage-current characteristics under irradiation of AM 1.5 (100 mA/cm$^2$) was 0.71. The initial conversion efficiency was 10.2%, and the conversion efficiency after the deterioration test of 4000 hours under AM 1.5 (100 mW/cm$^2$) was 8.6%. The photo-currents after the deterioration test were as follows: top 7.1 mA/cm$^2$; middle 7.2 mA/cm$^2$; bottom 7.7 mA/cm$^2$. Thus, the change in the photo-current of the top semiconductor junction was the smallest, so that the top semiconductor junction was the one with the best characteristics. After the change, the photo-current of the top semiconductor junction with the best characteristics was also the smallest.

Further, this sample was subjected to the environment test for 1000 hours in the environmental test box maintained at 85° C. and a humidity of 85%. The conversion efficiency decreased only 0.03%, and thus there was no problem at all.

Comparative Example 4

The substrate was a large 24 cm×35 cm substrate. The photoelectric conversion element was produced by the same method as in Example 1 except that the element was made using the apparatus scaled up so as to process a large substrate. In this case, a distribution of thicknesses was observed at the longitudinal edges because of deviation of the setting position of the opposite electrode in the deposition chamber for producing the i-layer of the top semiconductor junction by the high-frequency method. It was possible to eliminate the distribution by adjustment of the apparatus, but the layer was produced without adjustment of apparatus. When the protection member was formed, the protection member was formed in uniform thickness by the same method as in Example 1.

The photo-currents of the top, middle, and bottom semiconductor junctions, that were able to be measured from the absorption spectra before formation of the protection member, each differed depending upon locations, and were 7.4 to 7.6 mA/cm$^2$, 7.0 to 7.2 mA/cm$^2$, 7.4 to 7.6 mA/cm$^2$, respectively.

The photo-currents of the respective junctions after formation of the protection member were 7.1 to 7.3 mA/cm$^2$, 7.2 to 7.4 mA/cm$^2$, and 7.7 to 7.9 mA/cm$^2$. The fill factor obtained from voltage-current characteristics under irradiation of AM 1.5 (100 mA/cm$^2$) was 0.68. The initial conversion efficiency was 9.8%, and the conversion efficiency after the deterioration test of 4000 hours under AM 1.5 (100 mW/cm$^2$) was 7.7%. This is probably because there are regions where the photo-current of the top semiconductor junction with the best characteristics is not the smallest, depending upon the location, and these regions degrade the overall characteristics.

With the photoelectric conversion element in the configuration produced by the present invention, the fill factor is high and the photoelectric conversion efficiency is increased. The characteristics show little change over a long period, and reliability is high.

When the photoelectric conversion element is used as a roof material, the external view and color tone are also important factors in some cases. In such cases, where the color tone is given by intentionally reflecting light of a specific wavelength, the photo-deterioration can be suppressed to a low level without greatly decreasing the conversion efficiency.

In addition to these, since the thickness can be made larger, there is the effect of decreasing such defects as to fail to cover the shape of the substrate. The level of breakage under voltage is improved, so that the photoelectric conversion element can be obtained with high reliability.

Further, in addition to these, the production conditions of semiconductor junctions can be provided with a broad permissible range by adjusting the thickness and distribution of the protection member not transmitting light in the specific wavelength range.

The present invention succeeded in maintaining conversion efficiency with almost constant use for a long term, for example, for 10 to 20 years.

What is claimed is:

1. A photoelectric conversion element comprising a substrate, a plurality of semiconductor junctions made of non-single-crystalline semiconductors formed on said substrate, and a surface material covering said semiconductor junctions;

wherein said semiconductor junctions have respective absorption spectra different from each other and respective photo-deterioration rates different from each other, and a photo-current generated by the semiconductor junction of the least deterioration rate is larger than that generated by the semiconductor junction of the greatest deterioration rate in a state of absence of said surface material, and wherein said surface material absorbs light in a range corresponding to a part of the absorption spectrum of the semiconductor junction of the least deterioration rate, so that the photo-current generated by said semiconductor junction of the least deterioration rate becomes smaller than that generated by the semiconductor junction of the greatest deterioration rate.

2. A photoelectric conversion element according to claim 1, wherein the absorption spectrum of the semiconductor junction of the least deterioration rate is set to be not more than 500 nm and the absorption spectrum of the semiconductor junction of the greatest deterioration rate is set to be not less than 200 nm.

3. A photoelectric conversion element according to claim 1, wherein a peak of the absorption spectrum of the semiconductor junction of the least deterioration rate is set at a wavelength not more than 500 nm and a peak of the absorption spectrum of the semiconductor junction of the greatest deterioration rate at a wavelength not less than 700 nm.

4. A photoelectric conversion element according to claim 1, wherein said semiconductor junction of the least deterioration rate is placed above said semiconductor junction of the greatest deterioration rate.

5. A photoelectric conversion element according to claim 1, wherein said semiconductor junction of the least deterioration rate is placed above said semiconductor junction of the greatest deterioration rate and the semiconductor junction of a middle deterioration rate is provided between the semiconductor junction of the least deterioration rate and the semiconductor junction of the greatest deterioration rate.

6. A photoelectric conversion element according to claim 5, wherein a peak of the absorption spectrum of said semiconductor junction of the least deterioration rate is set at a wavelength not more than 500 nm, a peak of the absorption spectrum of said semiconductor junction of the middle deterioration rate is set in a wavelength range of 500 nm to 700 nm, and a peak of the absorption spectrum of said semiconductor junction of the greatest deterioration rate is set at a wavelength not less than 700 nm.

7. A photoelectric conversion element according to either one of claims 1 to 6, wherein said semiconductor junctions are junctions having a pin junction.

8. A photoelectric conversion element according to claim 1, wherein said semiconductor junction of the greatest deterioration rate has an i-type semiconductor deposited by plasma CVD using microwave power and said semiconductor junction of the least deterioration rate has an i-type layer deposited by plasma CVD using radio frequency power.

9. A photoelectric conversion element according to claim 1, wherein said surface material is a material containing an ultraviolet absorbing material.

10. A photoelectric conversion element according to claim 1, wherein said surface material is a material having a characteristic of absorbing light of wavelengths not more than 350 nm.

11. A photoelectric conversion element according to claim 10, wherein said surface material is a material comprised of a surface encapsulating material and a surface film.

12. A photoelectric conversion element according to claim 11, wherein said encapsulating material contains an ultraviolet absorbing material.

13. A photoelectric conversion element wherein when a light incident surface of a photoelectric conversion section comprising a plurality of non-single-crystalline semiconductor junctions and having a transparent, conductive layer thereon is exposed to light without a protection member, a photo-current generated by the semiconductor junction having best property is greater than that generated by at least one of the other semiconductor junctions and wherein when the light incident surface is exposed to light with a protection member having a transmittance of 0 to 90% for light in a specific wavelength range, a photo-current generated by the semiconductor junction having the best property is always smaller than those generated by the other semiconductor junctions upon subjection to a deterioration test.

14. A photoelectric conversion element wherein a photo-current generated by a semiconductor junction having best property is 0 to 6% larger than that generated by at least one of other semiconductor junctions and wherein under irradiation with light in a state of presence of a protection member having a transmittance of 0 to 90% for light in a specific wavelength range a photo-current generated by the semiconductor junction having the best property is always smaller than those generated by the other semiconductor junctions upon subjection to a deterioration test.

15. A building material comprising:
a) a photoelectric conversion element comprising a substrate, and a plurality of semiconductor junctions made of non-single-crystalline semiconductors formed on said substrate;
wherein said semiconductor junctions have respective absorption spectra different from each other and respective photo-deterioration rates different from each other, and a photo-current generated by the semiconductor junction of the least deterioration rate is larger than that generated by the semiconductor junction of the greatest deterioration rate in a state of absence of said surface material, and
wherein said surface material absorbs light in a range corresponding to a part of the absorption spectrum of the semiconductor junction of the least deterioration rate, so that the photo-current generated by said semiconductor junction of the least deterioration rate becomes smaller than that generated by the semiconductor junction of the greatest deterioration rate; and
b) a back material provided on a back surface of said photoelectric conversion element.

16. A building material according to claim 15, wherein said back material is a steel sheet for roof.

17. A building material according to claim 16, wherein said surface material is a material containing an ultraviolet absorbing material.

18. A building material according to claim 16, wherein said surface material is a material having a characteristic of absorbing light of wavelengths not more than 350 nm.

19. A building material according to claim 18, wherein said surface material is a material comprised of a surface encapsulating material and a surface film.

20. A building material according to claim 19, wherein said encapsulating material contains an ultraviolet absorbing material.

21. A power generation apparatus comprising:
a) a photoelectric conversion element comprising a substrate, a plurality of semiconductor junctions made of non-single-crystalline semiconductors formed on said substrate, and a surface material covering said semiconductor junctions;
wherein said semiconductor junctions have respective absorption spectra different from each other and respective photo-deterioration rates different from each other, and a photo-current generated by the semiconductor junction of the least deterioration rate is larger than that generated by the semiconductor junction of the greatest deterioration rate in a state of absence of said surface material, and wherein said surface material absorbs light in a range corresponding to a part of the absorption spectrum of the semiconductor junction of the least deterioration rate, so that the photo-current generated by said semiconductor junction of the least deterioration rate becomes smaller than that generated by the semiconductor junction of the greatest deterioration rate; and b) power converting means for converting power generated by said photoelectric conversion element.

22. A power generation apparatus according to claim 21, wherein said power converting means is means for converting the power from said photoelectric conversion element to ac waveform voltage.

23. A power generation apparatus according to claim 21, wherein said power converting means is means for converting the power from said photoelectric conversion element to dc waveform voltage.

* * * * *

UNITED STATES PATENT AND TRADEMARK OFFICE
CERTIFICATE OF CORRECTION

PATENT NO.   : 6,153,823
DATED        : November 28, 2000
INVENTOR(S)  : Atsushi Shiozaki et al.

It is certified that error appears in the above-identified patent and that said Letters Patent is hereby corrected as shown below:

Column 2,
Line 27, "conversion." should read -- conversion --.

Column 17,
Line 39, "$_{and}$" should read -- and --.

Column 25,
Line 30, "either" should read -- any --.

Signed and Sealed this

Fifth Day of February, 2002

Attest:

Attesting Officer

JAMES E. ROGAN
*Director of the United States Patent and Trademark Office*